United States Patent
Wu et al.

(10) Patent No.: US 11,574,918 B2
(45) Date of Patent: Feb. 7, 2023

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Yun-Chi Wu, Tainan (TW); Yu-Wen Tseng, Chiayi (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 24 days.

(21) Appl. No.: 17/340,704

(22) Filed: Jun. 7, 2021

(65) Prior Publication Data

US 2021/0296508 A1    Sep. 23, 2021

Related U.S. Application Data

(60) Continuation of application No. 16/859,155, filed on Apr. 27, 2020, now Pat. No. 11,031,412, which is a
(Continued)

(51) Int. Cl.
*H01L 27/1157* (2017.01)
*H01L 29/423* (2006.01)
(Continued)

(52) U.S. Cl.
CPC .......... *H01L 27/1157* (2013.01); *B82Y 10/00* (2013.01); *H01L 27/1203* (2013.01);
(Continued)

(58) Field of Classification Search
CPC ............. H01L 27/1157; H01L 27/1203; H01L 27/1237; H01L 29/0673; H01L 29/068;
(Continued)

(56) References Cited

U.S. PATENT DOCUMENTS 9,029,231 B2    5/2015  Toh et al.
2007/0164344 A1  7/2007  Park et al.
(Continued)

FOREIGN PATENT DOCUMENTS

CN           106409835 A    2/2017
KR      10-2014-0024210 A    2/2014
(Continued)

OTHER PUBLICATIONS

Notice of Allowance issued in corresponding Korean Patent Application No. 10-2017-0122660, dated May 21, 2019.
(Continued)

*Primary Examiner* — David Vu
(74) *Attorney, Agent, or Firm* — McDermott Will & Emery LLP

(57) ABSTRACT

A non-volatile memory (NVM) cell includes a semiconductor wire including a select gate portion and a control gate portion. The NVM cell includes a select transistor formed with the select gate portion and a control transistor formed with the control gate portion. The select transistor includes a gate dielectric layer disposed around the select gate portion and a select gate electrode disposed on the gate dielectric layer. The control transistor includes a stacked dielectric layer disposed around the control gate portion, a gate dielectric layer disposed on the stacked dielectric layer and a control gate electrode disposed on the gate dielectric layer. The stacked dielectric layer includes a first silicon oxide layer disposed on the control gate portion, a charge trapping layer disposed on the first silicon oxide, and a second silicon oxide layer disposed on the charge trapping layer.

20 Claims, 33 Drawing Sheets

Related U.S. Application Data division of application No. 16/198,100, filed on Nov. 21, 2018, now Pat. No. 10,665,602, which is a division of application No. 15/627,726, filed on Jun. 20, 2017, now Pat. No. 10,211,217.

(51) Int. Cl.

| | | |
|---|---|---|
| *H01L 27/12* | (2006.01) | |
| *H01L 29/51* | (2006.01) | |
| *H01L 29/66* | (2006.01) | |
| *H01L 29/06* | (2006.01) | |
| *B82Y 10/00* | (2011.01) | |
| *H01L 29/792* | (2006.01) | |
| *H01L 29/775* | (2006.01) | |
| H01L 27/11568 | (2017.01) | |

(52) U.S. Cl.
CPC ........ *H01L 27/1237* (2013.01); *H01L 29/068* (2013.01); *H01L 29/0673* (2013.01); *H01L 29/42344* (2013.01); *H01L 29/42392* (2013.01); *H01L 29/512* (2013.01); *H01L 29/517* (2013.01); *H01L 29/518* (2013.01); *H01L 29/66439* (2013.01); *H01L 29/66469* (2013.01); *H01L 29/66545* (2013.01); *H01L 29/66833* (2013.01); *H01L 29/775* (2013.01); *H01L 29/792* (2013.01); *H01L 27/11568* (2013.01)

(58) Field of Classification Search
CPC ......... H01L 29/42344; H01L 29/42392; H01L 29/512; H01L 29/517; H01L 29/518; H01L 29/66439; H01L 29/66469; H01L 29/66545; H01L 29/66833; H01L 29/775; H01L 29/792; H01L 27/11568; H01L 27/11551; H01L 27/11521; H01L 27/11526; H01L 27/11578; B82Y 10/00
See application file for complete search history.

(56) References Cited

U.S. PATENT DOCUMENTS

| | | |
|---|---|---|
| 2009/0021988 A1 | 1/2009 | Hong et al. |
| 2013/0119455 A1 | 5/2013 | Chen et al. |
| 2014/0048867 A1* | 2/2014 | Toh ............... H01L 21/845 257/E21.423 |
| 2014/0217509 A1 | 8/2014 | Chang et al. |
| 2014/0319623 A1 | 10/2014 | Tsai et al. |
| 2015/0145064 A1 | 5/2015 | Ramachandran et al. |
| 2016/0064389 A1 | 3/2016 | Mihara |
| 2016/0064531 A1 | 3/2016 | Xiao |
| 2016/0307911 A1 | 10/2016 | Wu et al. |
| 2016/0343706 A1 | 11/2016 | Chang et al. |
| 2017/0062440 A1 | 3/2017 | Arigane et al. |
| 2017/0170270 A1 | 6/2017 | Chu et al. |

FOREIGN PATENT DOCUMENTS

| | | |
|---|---|---|
| KR | 10-2015-0040807 A | 4/2015 |
| KR | 20160018985 A | 2/2016 |
| TW | 201442153 A | 11/2014 |
| TW | 201622110 A | 6/2016 |
| TW | 201639128 A | 11/2016 |
| WO | 2014/008161 A1 | 1/2014 |

OTHER PUBLICATIONS

Taiwanese Office Action issued in corresponding Taiwanese Patent Application No. 106132794, dated Mar. 16, 2018.
German Office Action issued in corresponding German Patent Application No. 10 2017 114 426.9, dated Feb. 21, 2018.
Notice of Allowance issued in U.S. Appl. No. 15/627,726, dated Oct. 25, 2018.
Notice of Allowance issued in U.S. Appl. No. 16/198,100, dated Jan. 21, 2020.
Non-Final Office Action issued in U.S. Appl. No. 16/198,100, dated Jul. 23, 2019.
Notice of Allowance issued in U.S. Appl. No. 16/859,155, dated Feb. 8, 2021.

* cited by examiner

METHOD OF MANUFACTURING A SEMICONDUCTOR DEVICE AND A SEMICONDUCTOR DEVICE

CROSS-REFERENCE TO RELATED APPLICATIONS

This application is a continuation application of U.S. patent application Ser. No. 16/859,155 filed on Apr. 27, 2020, now U.S. Pat. No. 11,031,412, which is a divisional application U.S. patent application Ser. No. 16/198,100 filed on Nov. 21, 2018, now U.S. Pat. No. 10,665,602, which is a divisional application of U.S. patent application Ser. No. 15/627,726, filed on Jun. 20, 2017, now U.S. Pat. No. 10,211,217, the entire disclosures of each of which are incorporated herein by reference.

TECHNICAL FIELD

The disclosure relates to method of manufacturing semiconductor integrated circuits, and more particularly to a semiconductor device including a non-volatile memory and a method of manufacturing the same.

BACKGROUND

As the semiconductor industry has progressed into nanometer technology process nodes in pursuit of higher device density, higher performance, and lower costs, challenges from both fabrication and design issues have resulted in the development of three-dimensional designs. Integration of a non-volatile memory in a semiconductor device has been required to achieve a higher functionality of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

In the present embodiments, a semiconductor device includes non-volatile memory (NVM) cells, such as a semiconductor-oxide-nitride-oxide-semiconductor (SONOS) type NVM cell. In particular, the present embodiments are directed to a two-transistor (2T) SONOS NVM cell utilizing a gate-all-around (GAA) structure.

Figure 1A:
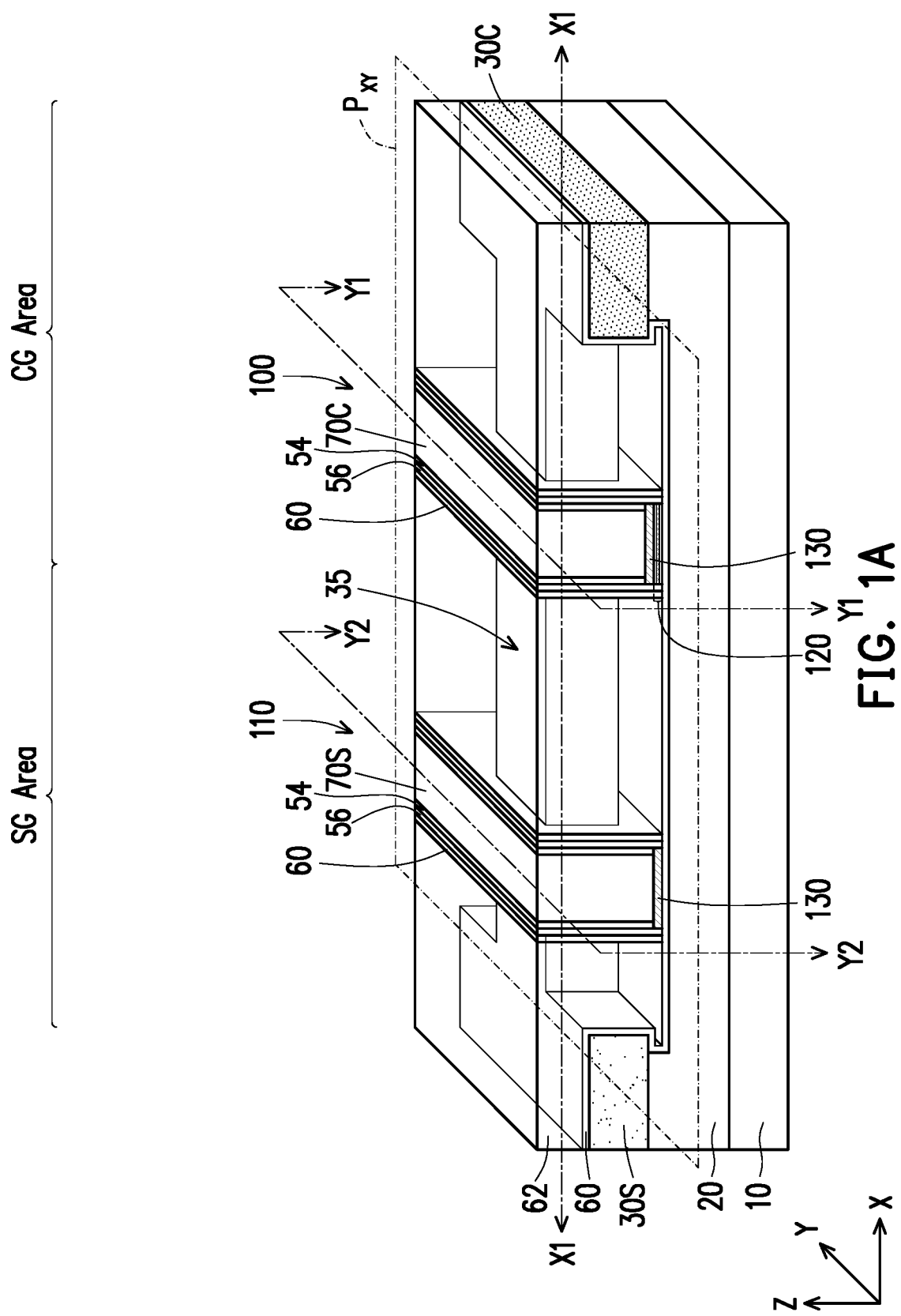
FIG. 1A is a perspective view of a non-volatile memory cell in accordance with embodiments of the present disclosure.
Figure 1B:
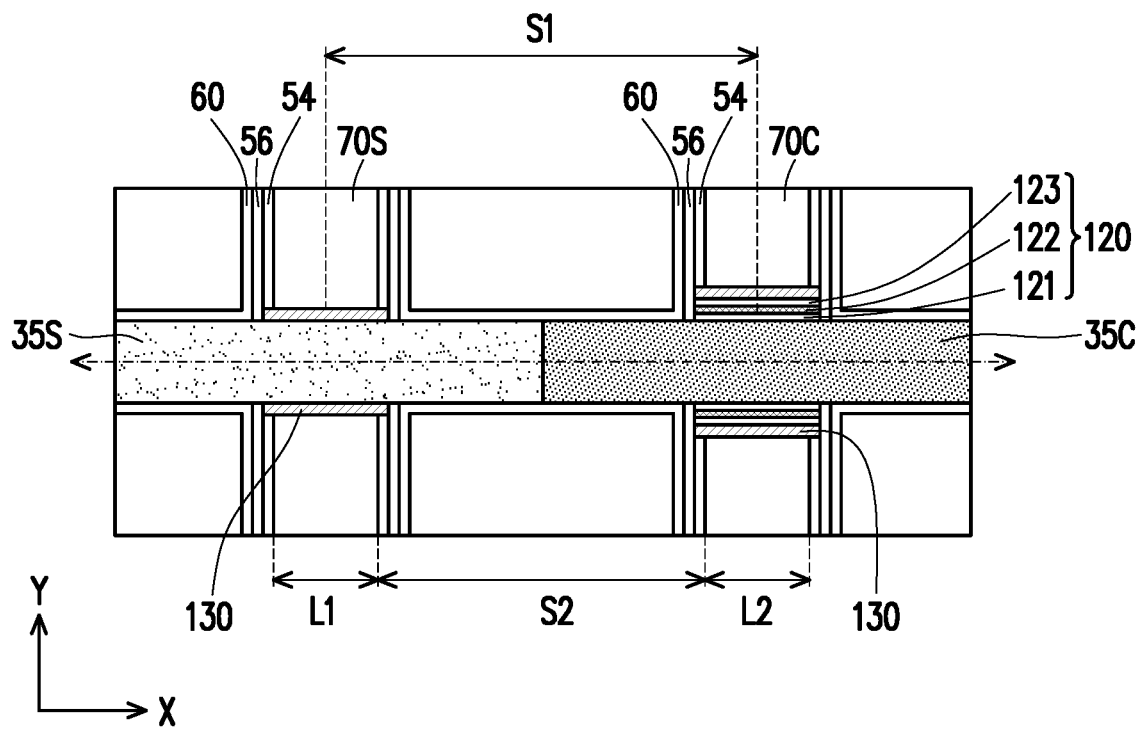
FIG. 1B is a cross sectional view corresponding to the plane $P_{XY}$ along X1-X1 line of FIG. 1A.
Figure 1C:
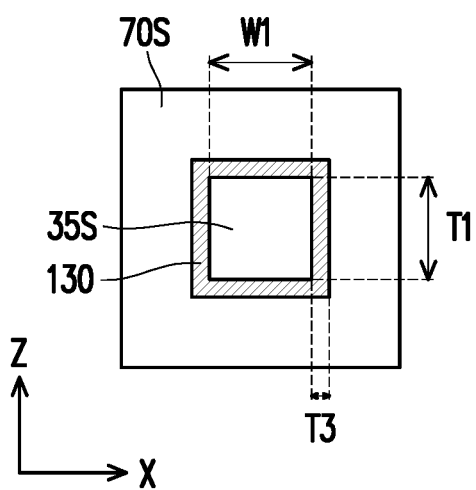
FIG. 1C is a cross sectional view corresponding to line Y2-Y2 of FIG. 1A
Figure 1D:
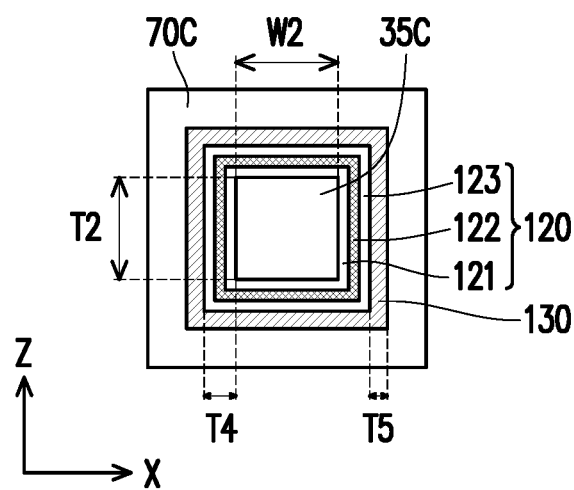
FIG. 1D is a cross sectional view corresponding to line Y1-Y1 of FIG. 1A.

FIGS. 1A-1D illustrate a structure of a 2T SONOS NVM cell in accordance with some embodiments of the present disclosure. FIG. 1B is a cross sectional view corresponding to the plane $P_{XY}$ along X1-X1 line of FIG. 1A, FIG. 1C is a cross sectional view corresponding to line Y2-Y2 of FIG. 1A and FIG. 1D is a cross sectional view corresponding to line Y1-Y1 of FIG. 1A.

As shown in FIGS. 1A-1D, the 2T SONOS NVM cell includes a control transistor 100 and a select transistor 110, both of which are GAA field effect transistors (FETs). These transistors are disposed over an insulating layer 20 disposed on a substrate 10.

The select transistor 110 includes a semiconductor wire 35S extending in the X direction, a gate dielectric layer 130 wrapping around a part of the semiconductor wire 35S, and a select gate (SG) electrode 70S formed on and around the gate dielectric layer 130 wrapping around the part of the semiconductor wire 35S. The select transistor 110 further includes first sidewall spacers 54 disposed on the select gate electrode 70S and second sidewall spacers 56 disposed next to the first sidewall spacers 54. In some embodiments, the gate dielectric layer 130 is also disposed on the insulating layer 20.

The control transistor 100 includes a semiconductor wire 35C, a stacked dielectric layer 120 wrapping around a part of the semiconductor wire 35C, and a control gate (CG) electrode 70C formed on and around the stacked gate dielectric layer 120 wrapping around the part of the semiconductor wire 35C. The control transistor 110 further includes first sidewall spacers 54 disposed on the control gate electrode 70C and second sidewall spacers 56 disposed next to the first sidewall spacers 54. In some embodiments, the gate dielectric layer 130 is also disposed between the stacked dielectric layer 120 and the control gate electrode 70C, and on the insulating layer 20.

The semiconductor wires 35S and 35C are formed as one wire structure and have anchor portions 30S and 30C, respectively. The semiconductor wires 35S and 35C are made of a suitable elemental semiconductor, such as silicon or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide, indium arsenide, indium phosphide, indium antimonide, gallium arsenic phosphide, or gallium indium phosphide), or the like. The semiconductor wires 35S and 35C are appropriately doped with impurities. The doping concentration for the semiconductor wire 35S is different from that for the semiconductor wire 35C in some embodiments. The thickness T1, T2 of semiconductor wires 35S and 35C is in a range from about 3 nm to 50 nm, and the width W1, W2 of semiconductor wires 35S and 35C is in a range from about 3 nm to 30 nm, in some embodiments. In some embodiments, the cross sectional shape of the semiconductor wires 35S and 35C may be substantially a square with rounded corners, a rectangle with rounded corners, an oval or a circle.

In some embodiments, the gate dielectric layer 130 includes one or more high-k dielectric layers having a dielectric constant greater than that of $SiO_2$. For example, the gate dielectric layer 130 may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloy oxides, and combinations thereof. Exemplary materials include $MgO_x$, $BaTi_xO_y$, $BaSr_xTi_yO_z$, $SrTiO_3$, $PbTi_xO_y$, $PbZr_xTi_yO_z$, SiCN, SiON, SiN, $Al_2O_3$, $La_2O_3$, $Ta_2O_3$, $Ta_2O_5$, $Y_2O_3$, $HfO_2$, $ZrO_2$, HfSiON, $YGe_xO_y$, $YSi_xO_y$ and $LaAlO_3$, and the like. In some embodiments, the gate dielectric layer 130 has a thickness T3, T5 of about 0.5 nm to about 5 nm.

The stacked dielectric layer 120 includes a first dielectric layer 121 disposed on and around the semiconductor wire 35C, a second dielectric layer 122 disposed on the first dielectric layer 121 and a third dielectric layer 123 disposed on the second dielectric layer. In some embodiments, the first and third dielectric layers 121 and 123 are made of $SiO_2$ or other suitable metal oxide dielectric materials. The stacked dielectric layer 120 has a thickness T4 of about 5 nm to about 20 nm in some embodiments. In some embodiments, the first dielectric layer (as an FN tunneling layer) has a thickness of about 1 nm to about 10 nm and the third dielectric layer has a thickness of about 1 nm to about 10 nm. The second dielectric layer 122, which functions as a charge trapping layer of an NVM cell, is made of one or more of SiN, SiON, $HfO_2$, $ZrO_2$ or other suitable dielectric materials. Si-dots may be used as the charge trapping layer. In some embodiments, second dielectric layer 122 has a thickness of about 3 nm to about 12 nm.

The gate electrodes 70S and 70C include one or more conductive materials selected from a group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the gate electrodes 70S and 70C include a conductive material selected from the group consisting of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used for the gate electrodes. In certain embodiments of the present disclosure, the gate electrodes 70S and 70C include one or more work function adjustment layers disposed on the gate dielectric layer 130. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FinFET, one or more of TaN, TaAlC, TiN, TiC, Co, TiAl, HfTi TiSi and TaSi is used as the work function adjustment layer, and for the p-channel FinFET, one or more of TiAlC, Al, TiAl, TaN, TaAlC, TiN, TiC and Co is used as the work function adjustment layer.

The width L1 of the select gate electrode 70S is in a range from about 5 nm to about 50 nm and the width L2 of the select gate electrode 70C is in a range from about 5 nm to about 50 nm, in some embodiments. The width L1 may be the same as or different from the width L2. A pitch Si between the select gate electrode 70S and the control gate electrode 70C is in a range from about 30 nm to about 200 nm in some embodiments.

In some embodiments, the substrate 10 may be made of a suitablesemiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide, indium arsenide, indium phosphide, indium antimonide, gallium arsenic phosphide, or gallium indium phosphide), or the like. The insulating layer 20 may be made of $SiO_2$ or other suitable insulating material.

Further, as shown in FIG. 1A, a bottom etch-stop-layer (BESL) 60 and an interlayer dielectric (ILD) layer 62 are formed. The BESL 60 may be made of SiN and/or SiON or any other suitable dielectric material and the ILD layer 62 is made of $SiO_2$, SiOC and/or SiCN or any other suitable dielectric material.

Figure 1E:
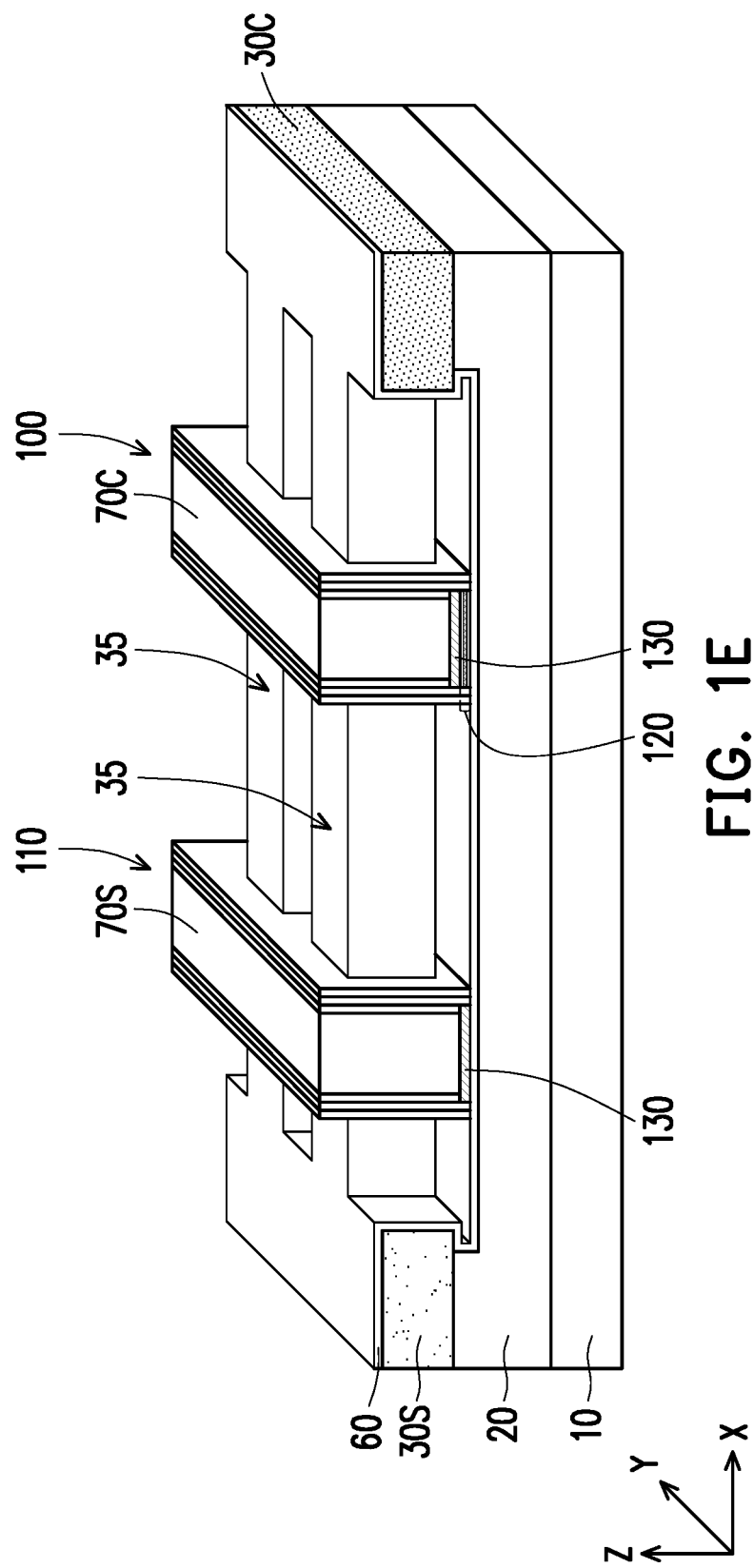
FIG. 1E is a perspective view of a non-volatile memory cell in accordance with embodiments of the present disclosure.

FIG. 1E is a perspective view of a non-volatile memory cell in accordance with embodiments of the present disclosure. In FIG. 1E, two or more semiconductor wires 35 are disposed over the substrate 10 and the select gate electrode 70S and the control gate electrode 70C are disposed over the two or more semiconductor wires.

FIGS. 2-17 illustrate various stages of a semiconductor device fabrication process in accordance with embodiments of the present disclosure. It is understood that additional operations can be provided before, during, and after processes shown by FIGS. 2-17, and some of the operations described below can be replaced or eliminated, for additional embodiments of the method. The order of the operations/processes may be interchangeable.

Figure 2:
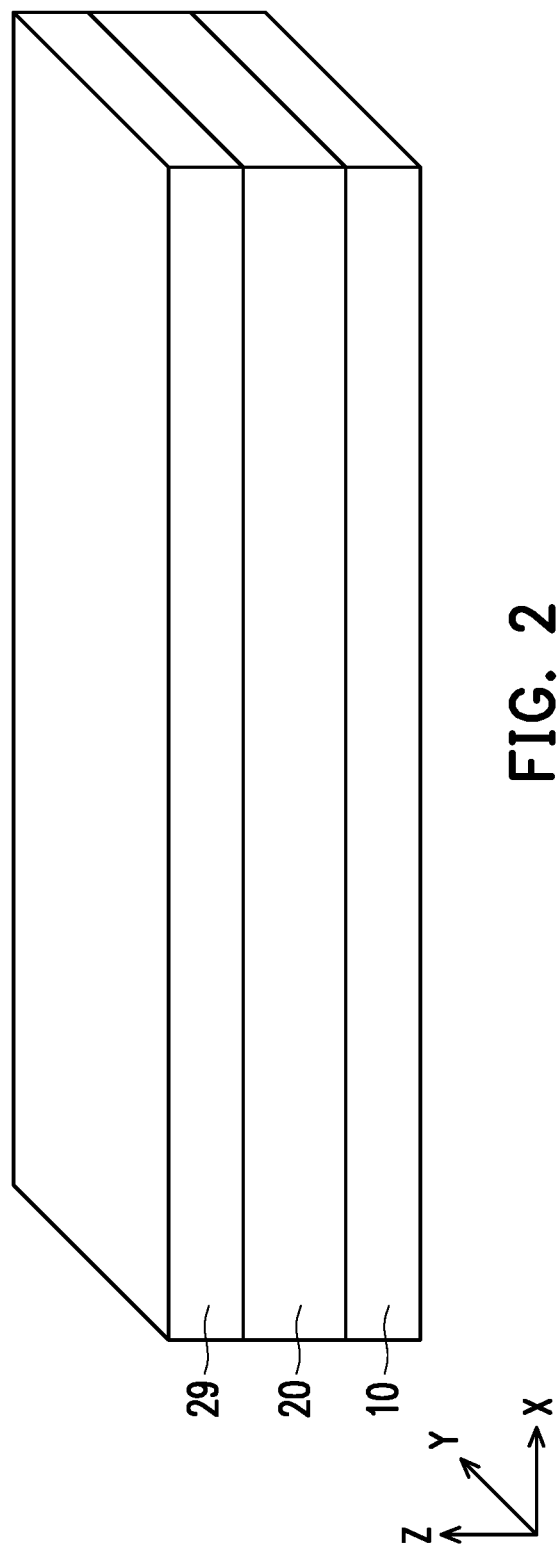
FIG. 2 illustrates one of the various stages in a semiconductor device fabrication process in accordance with embodiments of the present disclosure.

In FIG. 2, a semiconductor-insulator-semiconductor structure including a substrate 10, an insulating layer 20 and an upper semiconductor layer 29 is prepared. In some embodiments, the semiconductor-insulator-semiconductor structure is a silicon-on-insulator (SOI) wafer. The thickness of the insulating layer 20 is in a range from about 100 nm to 3000 nm in some embodiments. The thickness of the upper semiconductor layer 29 is in a range from about 10 nm to 200 nm in some embodiments.

Figure 3:
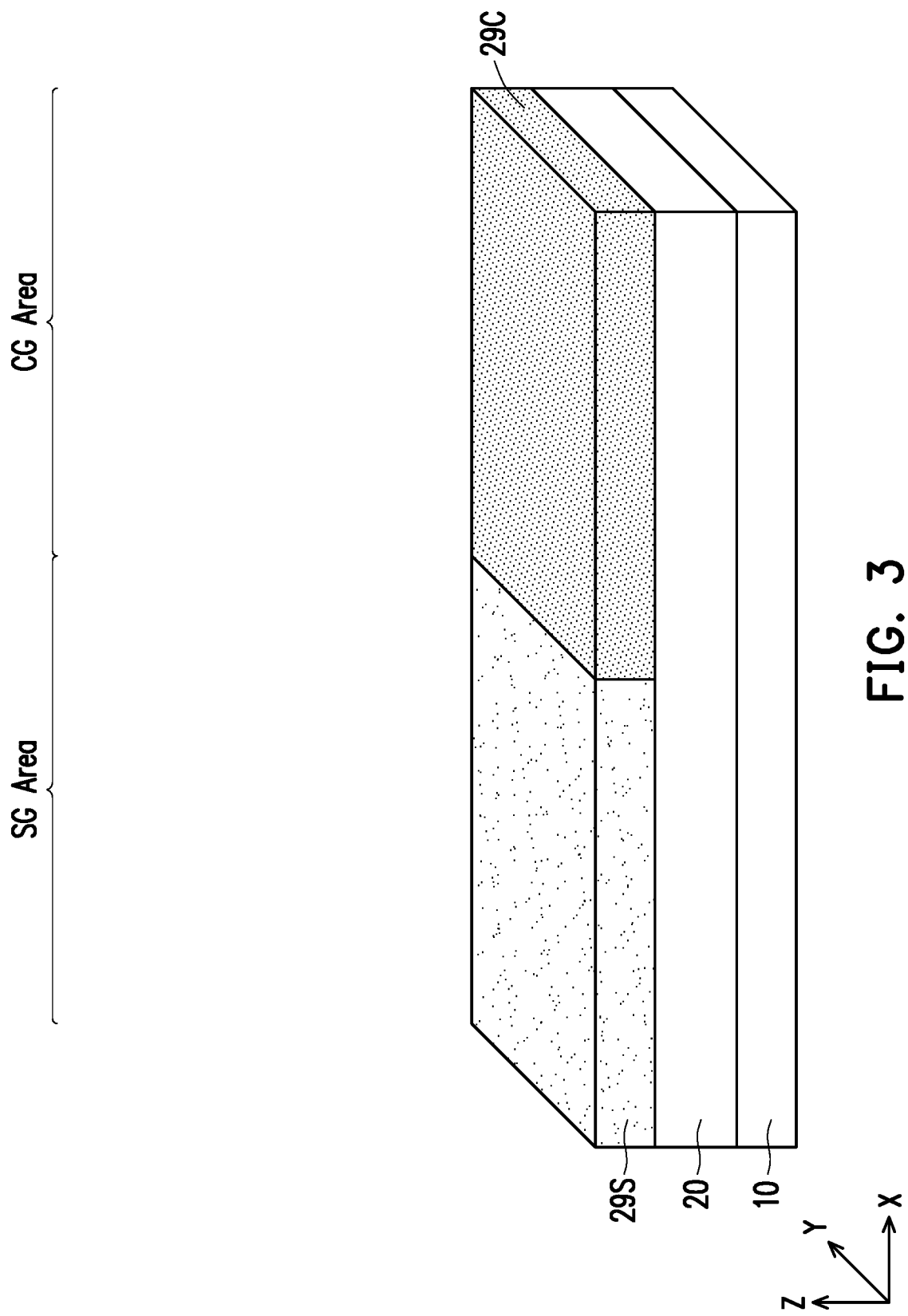
FIG. 3 illustrates one of the various stages in a semiconductor device fabrication process in accordance with embodiments of the present disclosure.

As shown in FIG. 3, impurities are introduced to the upper semiconductor layer 29 in a select gate area and a control gate area, respectively, thereby forming a select gate (SG) well layer 29S and a control gate (CG) well layer 29C. The impurities, such as B ($BF_2$), In and As, or other suitable elements, are introduced by ion implantation operations with appropriate photo lithography operations. The doping concentration for the select gate well layer 29S is in a range from about $1\times10^{12}$ to about $1\times10^{14}$ $cm^{-3}$, and the doping concentration for the control gate well layer 29C is in a range from about $1\times10^{12}$ to about $1\times10^{14}$ $cm^{-3}$, in some embodiments. In some embodiments, the implantation operations for the SG well and CG well are not performed at this stage of the manufacturing operation, but rather, are performed at a later stage.

Figure 4:
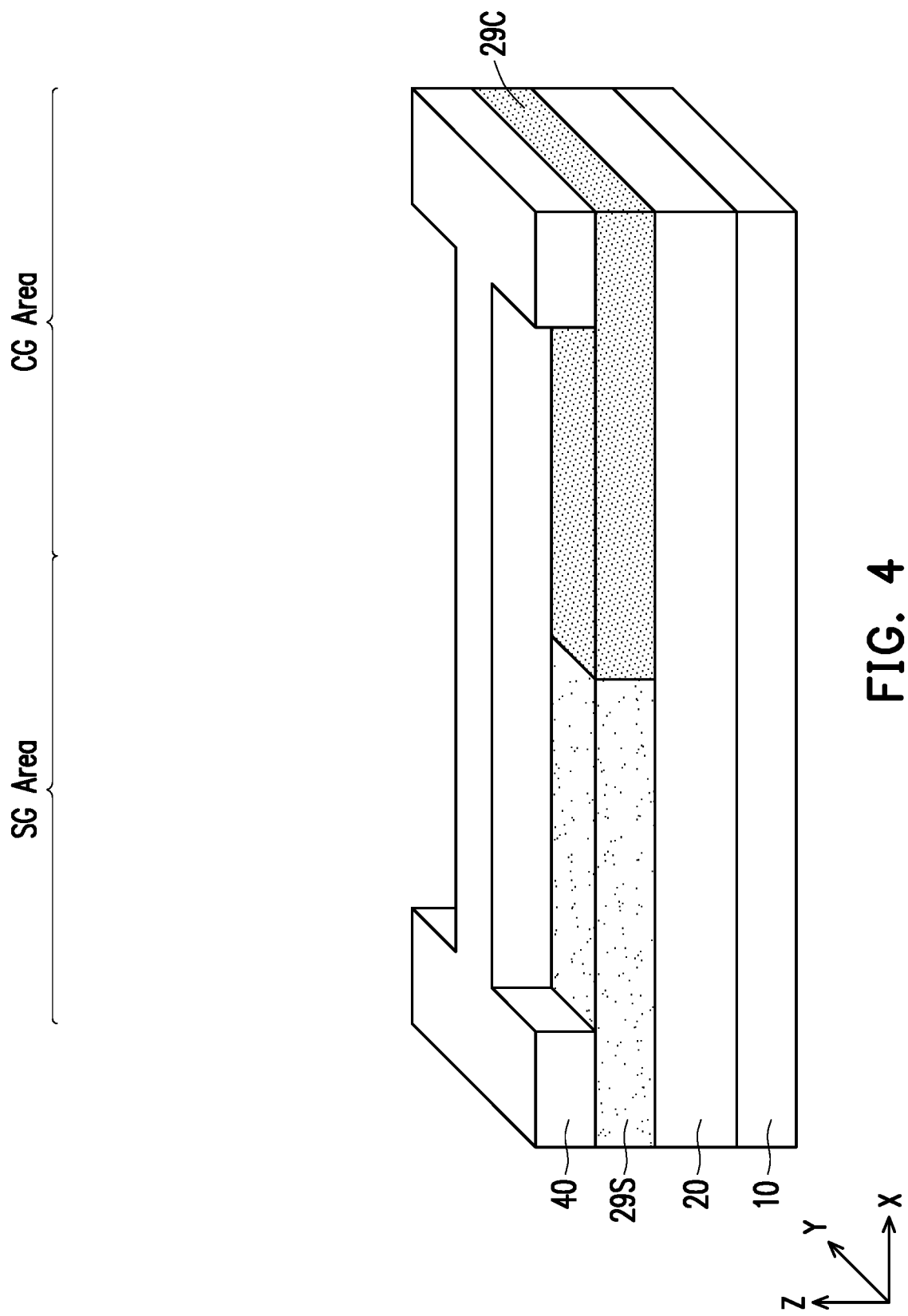
FIG. 4 illustrates one of the various stages in a semiconductor device fabrication process in accordance with embodiments of the present disclosure.

Then, as shown in FIG. 4, a mask pattern 40 is formed over the select gate well layer 29S and the control gate well layer 29C. The mask pattern 40 may be a photo resist pattern or a hard mask pattern formed by one or more layers of $SiO_2$ and SiN, or any other suitable material. The mask pattern 40 may have an "I" shape having a main portion and anchor portions disposed at both ends of the main portion.

Figure 5:
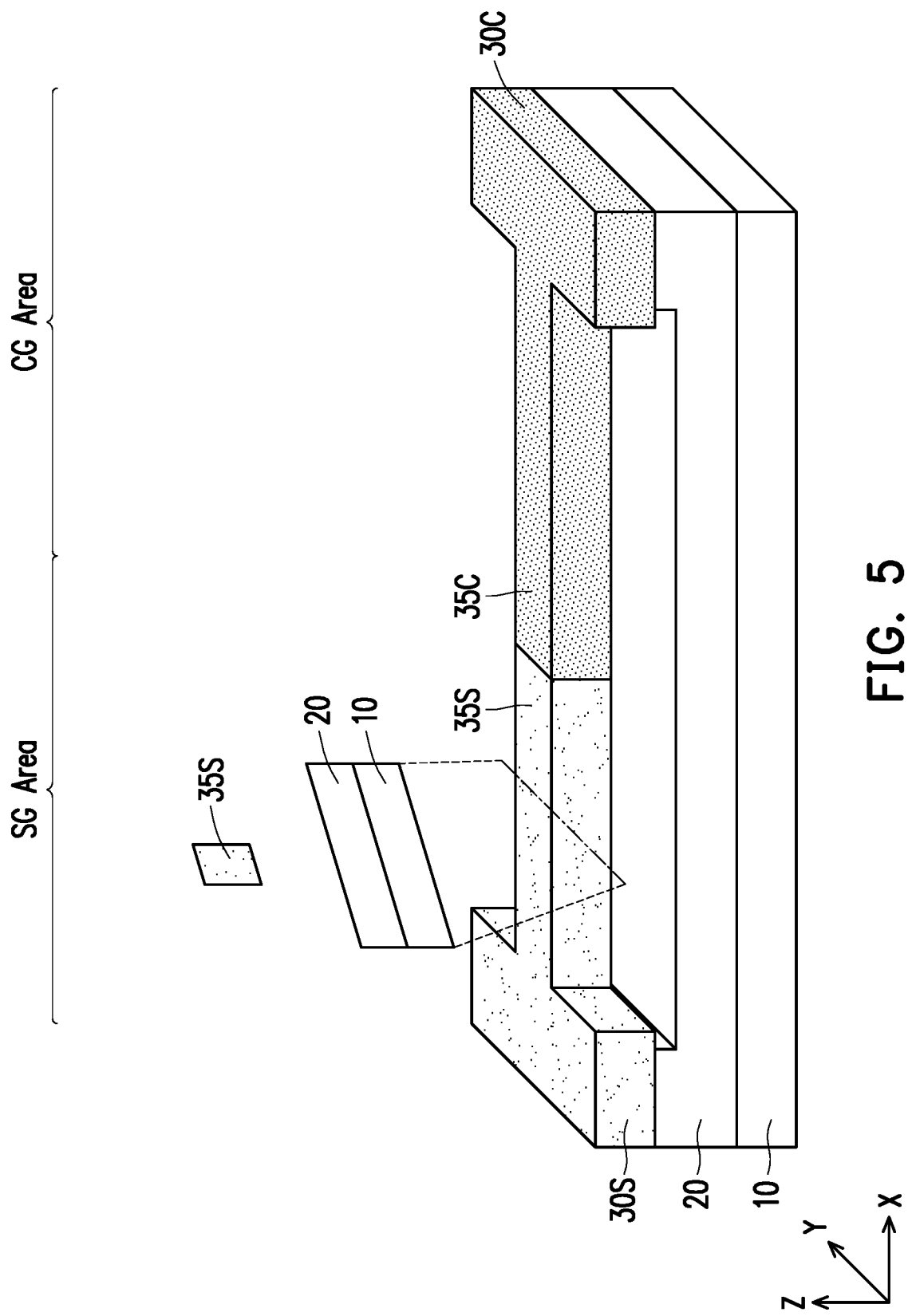
FIG. 5 illustrates one of the various stages in a semiconductor device fabrication process with a cross sectional view in accordance with embodiments of the present disclosure.

Next, as shown in FIG. 5 with a cross sectional view, the upper semiconductor layer 29 (the select gate well layer 29S and the control gate well layer 29C) is patterned by using the mask pattern 40 as an etching mask, and the insulating layer 20 is recessed by dry and/or wet etching. By this recess etching, the insulating layer 20 under the main portion of the "I" shape of the upper semiconductor layer 29 is removed thereby forming a semiconductor wire 35S and 35C, and anchor portions 30S and 30C, as shown in FIG. 5. In some embodiments, the implantation operations for the SG well and CG well are performed after the wire structure is formed. After the patterning of the upper semiconductor layer 29, the mask pattern 40 is removed.

Figure 6:
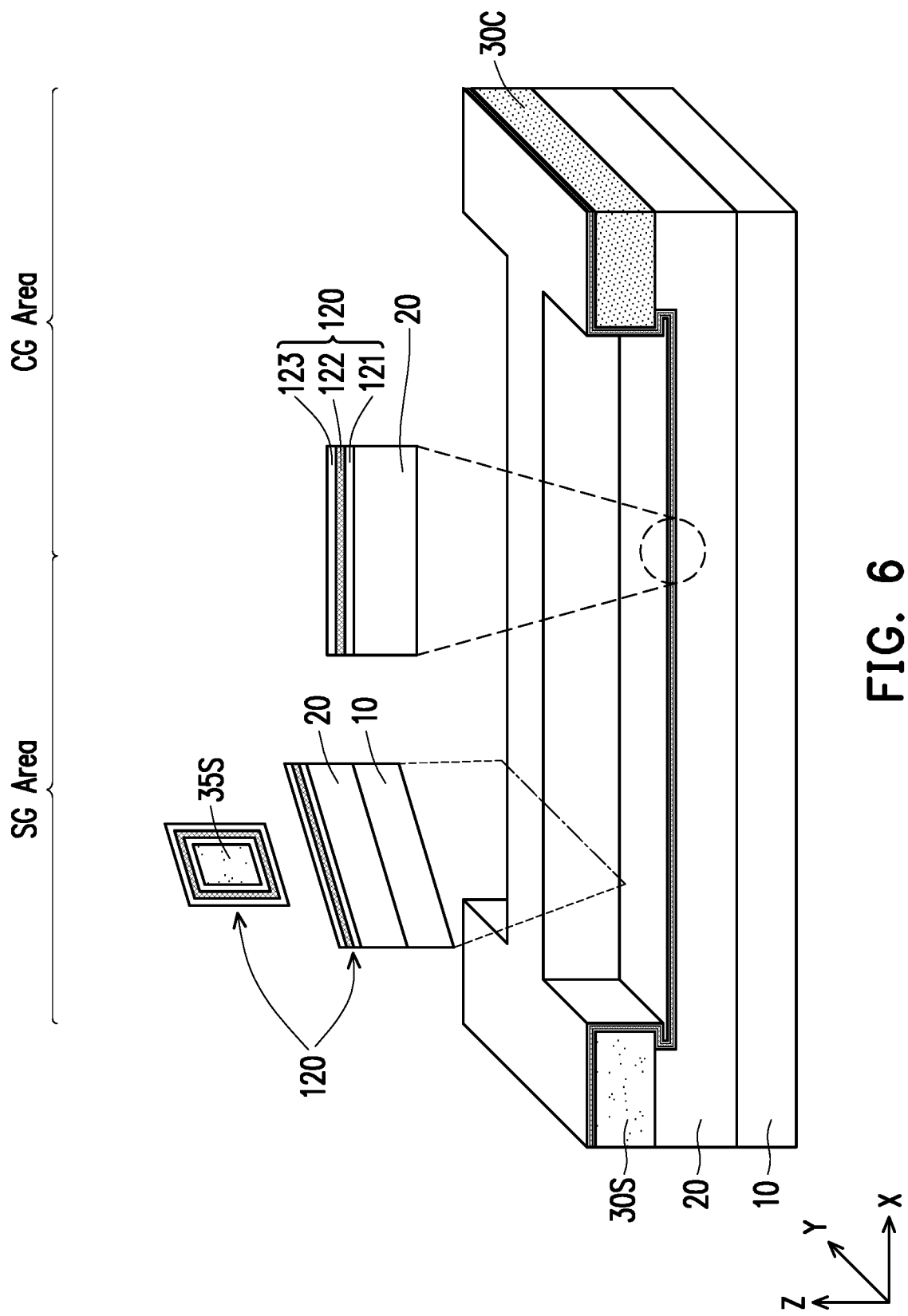
FIG. 6 illustrates one of the various stages in a semiconductor device fabrication process with an enlarged view in accordance with embodiments of the present disclosure.

After the semiconductor wire is formed, a stacked dielectric layer 120 is formed to wrap around the semiconductor wire and on the other remaining portions over the substrate, as shown in FIG. 6. The stacked dielectric layer 120 including the first to third dielectric layer 121, 122, 123 can be formed by thermal oxidation, chemical vapor deposition (CVD), physical vapor deposition (PVD) or atomic layer deposition (ALD).

Figure 7:
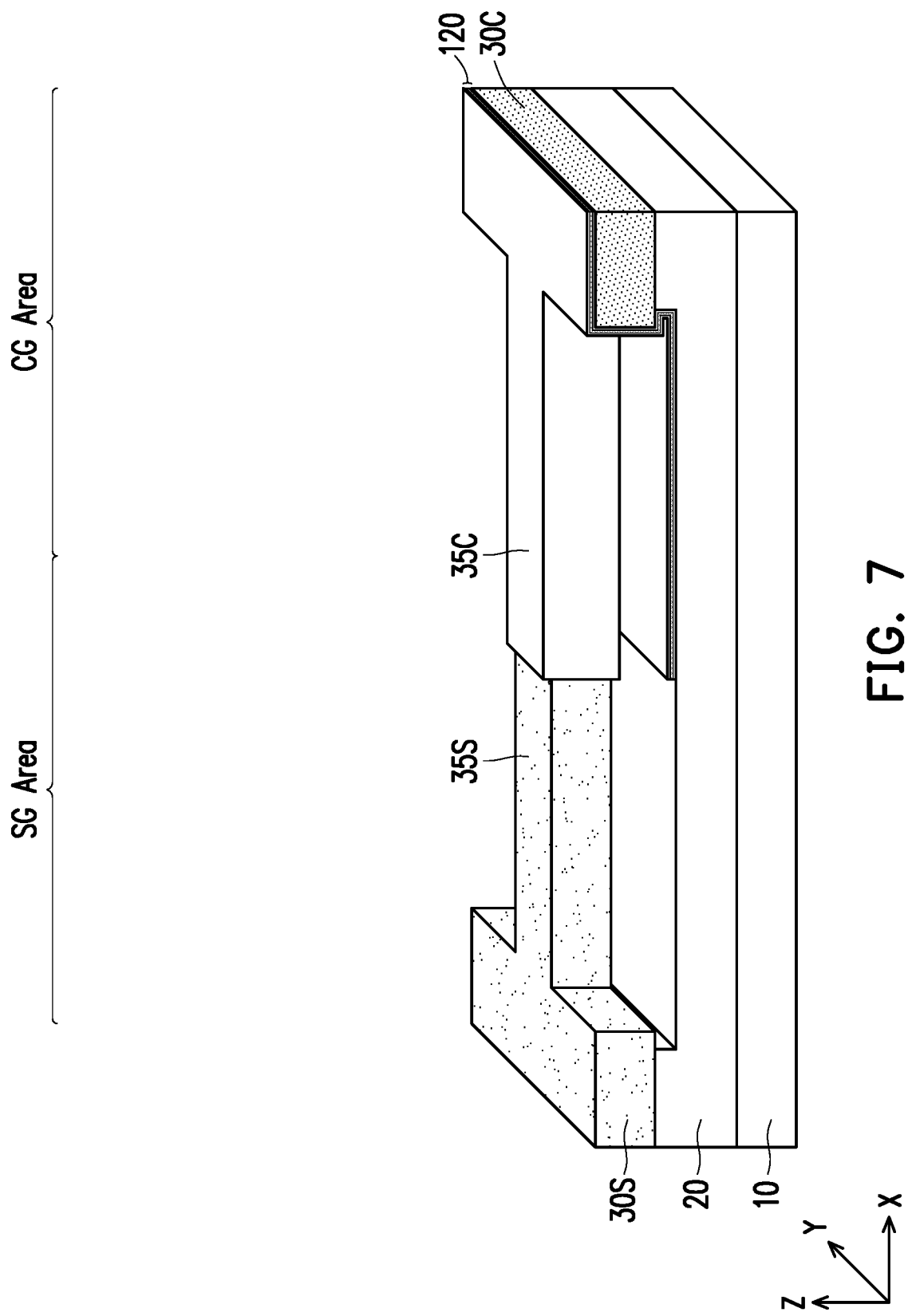
FIG. 7 illustrates one of the various stages in a semiconductor device fabrication process in accordance with embodiments of the present disclosure.

Then, as shown in FIG. 7, the stacked dielectric layer 120 is patterned by using lithograph and etching operations, thereby removing the stacked dielectric layer 120 in the SG area.

Figure 8:
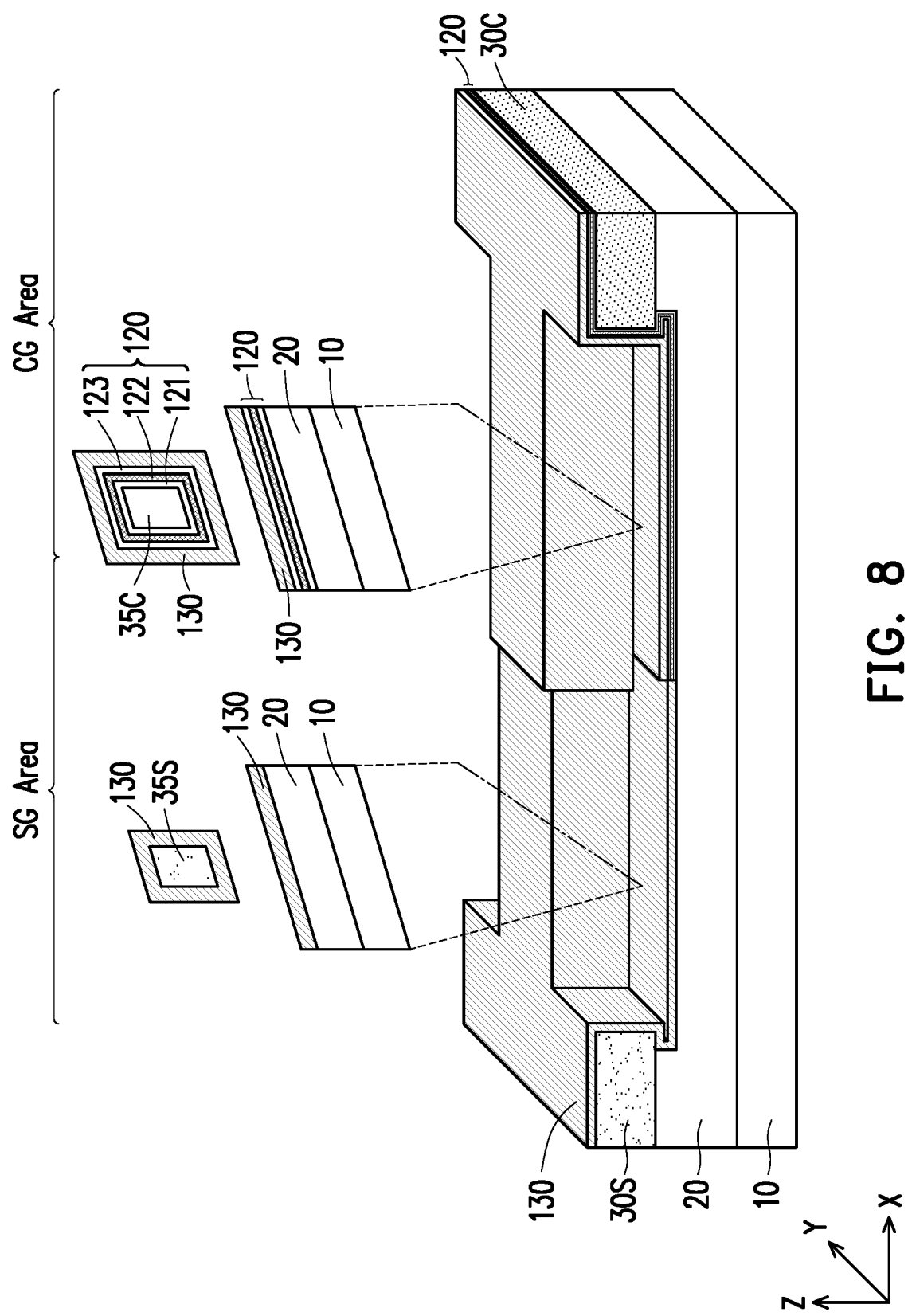
FIG. 8 illustrates one of the various stages in a semiconductor device fabrication process in accordance with embodiments of the present disclosure.

Further, as shown in FIG. 8, the gate dielectric layer 130 is formed to wrap around the semiconductor wire 35S and the stacked dielectric layer 120 formed around the semiconductor wire 35C and on other remaining portions over the substrate. The gate dielectric layer 130 is a high-k dielectric layer in some embodiments, and an interfacial oxide layer is formed on the semiconductor wire 35S before forming the high-k gate dielectric layer 130. The gate dielectric layer 130 may be formed by CVD, PVD or ALD.

Figure 9:
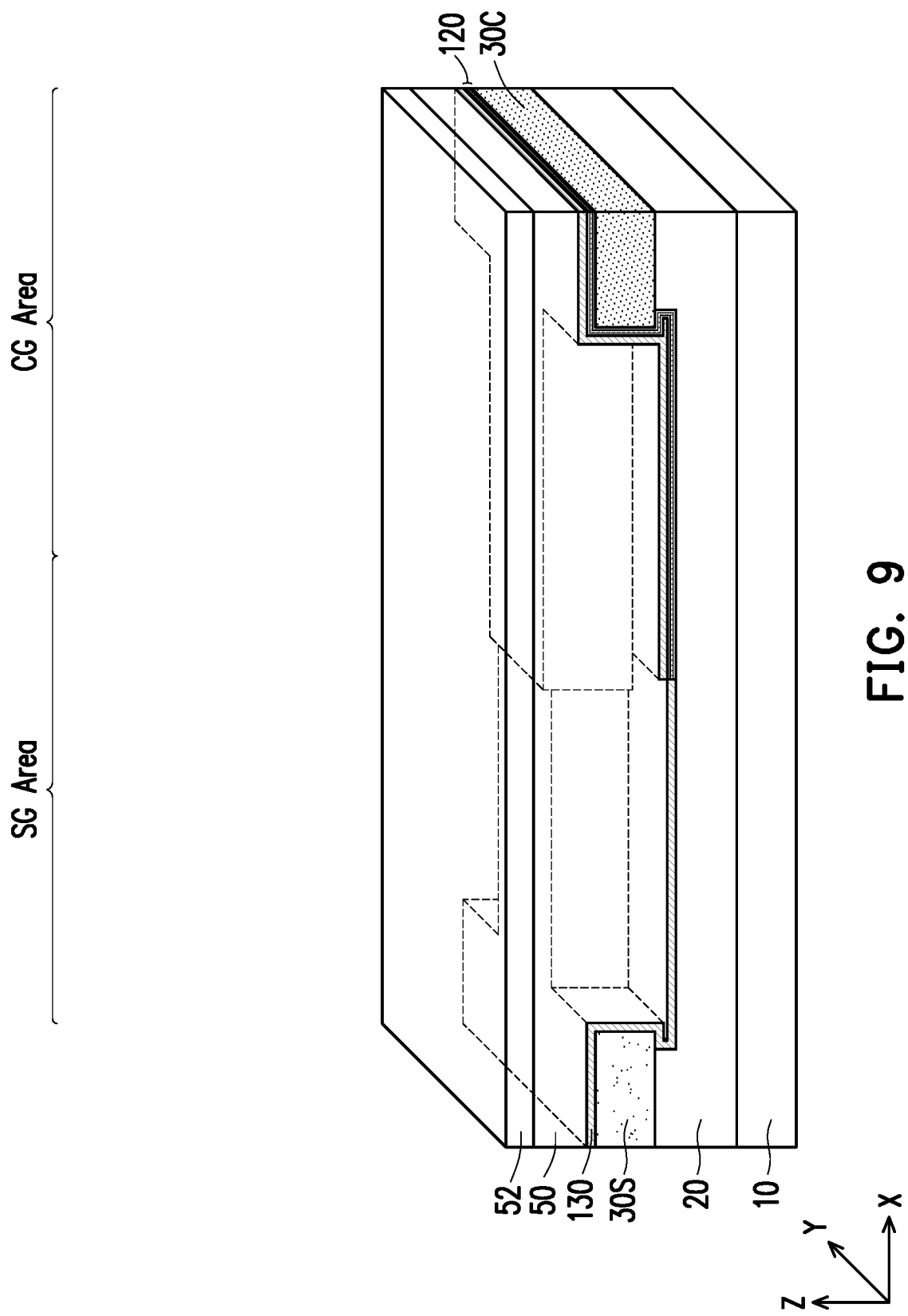
FIG. 9 illustrates one of the various stages in a semiconductor device fabrication process in accordance with embodiments of the present disclosure.

Subsequently, as shown in FIG. 9, a dummy gate layer 50 is formed over the gate dielectric layer 130 and a hard mask layer 52 is further formed on the dummy gate layer 50. The dummy gate layer 50 may be polysilicon or amorphous silicon, and the hard mask layer 52 may be made of one or more layers of $SiO_2$ and SiN.

Figure 10:
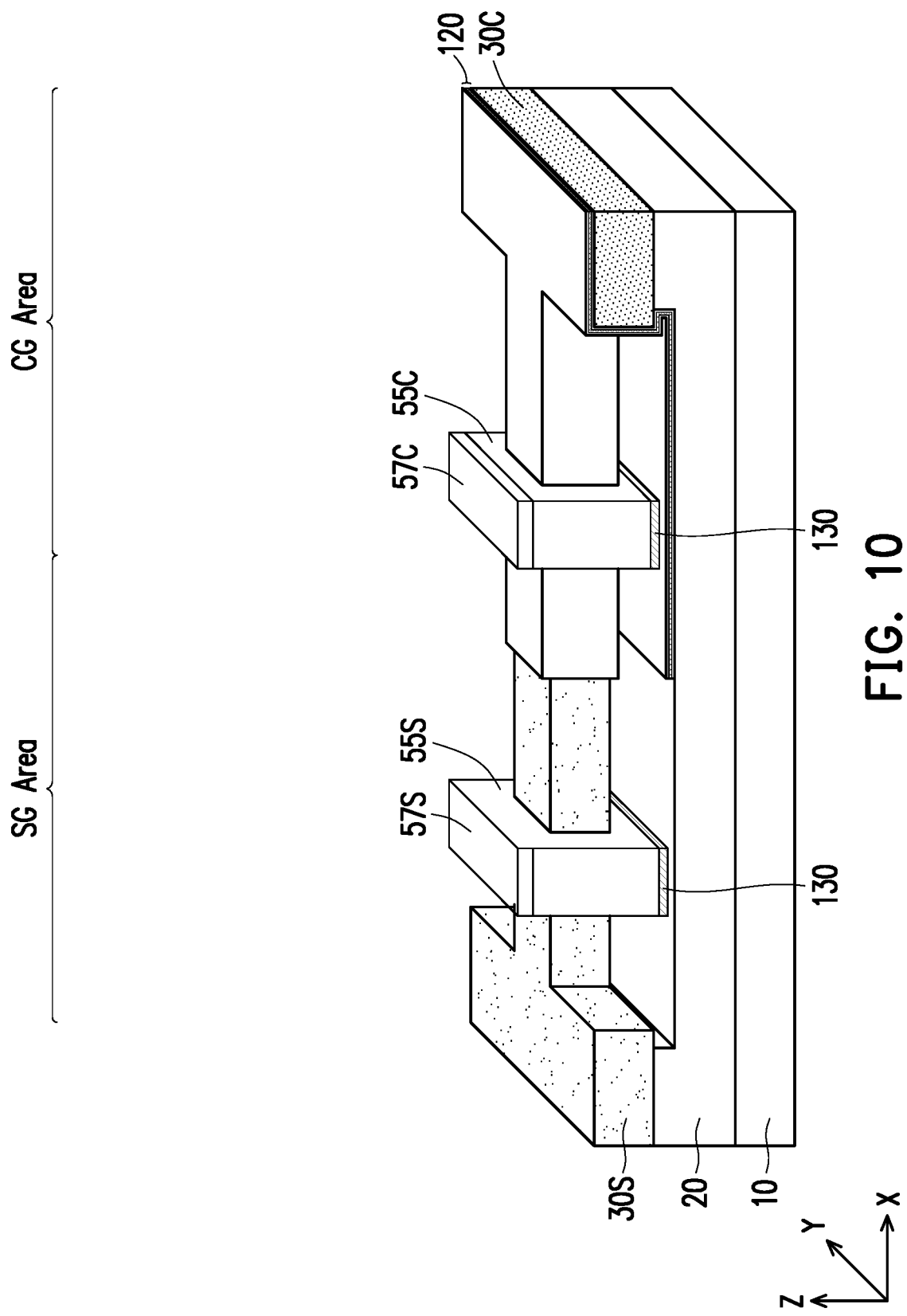
FIG. 10 illustrates one of the various stages in a semiconductor device fabrication process in accordance with embodiments of the present disclosure.

Then, as shown in FIG. 10, by using lithography and etching operations, the dummy gate layer 50 and the hard mask layer 52 are patterned into a dummy select gate 55S with a cap layer 57S and a dummy control gate 55C with a cap layer 57C. As shown in FIG. 10, the gate dielectric layer 130 is also etched except for the region under the dummy gates, while the stacked dielectric layer 120 in the CG area is not removed. In some embodiments, one or more of the first to third dielectric layers (e.g., the third dielectric layer 123) may be removed.

Figure 11:
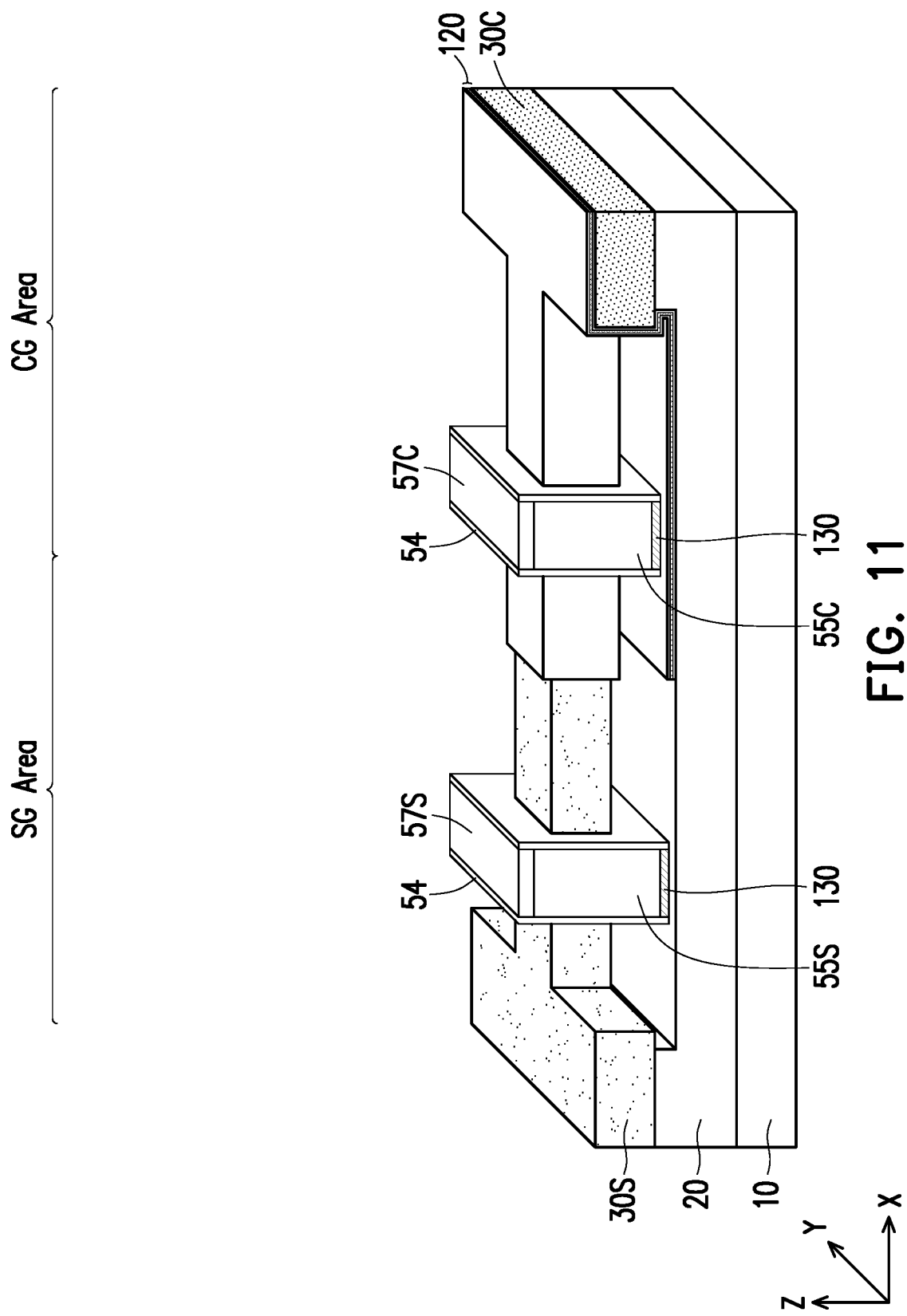
FIG. 11 illustrates one of the various stages in a semiconductor device fabrication process in accordance with embodiments of the present disclosure.

After the dummy gates are formed, the first sidewall spacers 54 are formed on opposing major faces of the dummy select gate 55S and the dummy control gate 55C, as shown in FIG. 11. The first sidewall spacers 54 may include one or more layers of $SiO_2$, SiN, SiON, SiOCN or other suitable dielectric material and may be formed by film forming and anisotropic etching. Although sidewalls may also be formed on the anchor portions 30S and 30C or other portions, such sidewalls are not illustrated in FIG. 11 for simplicity. The thickness of the first sidewall spacers 54 is in a range from about 5 nm to about 50 nm in some embodiments.

Figure 12:
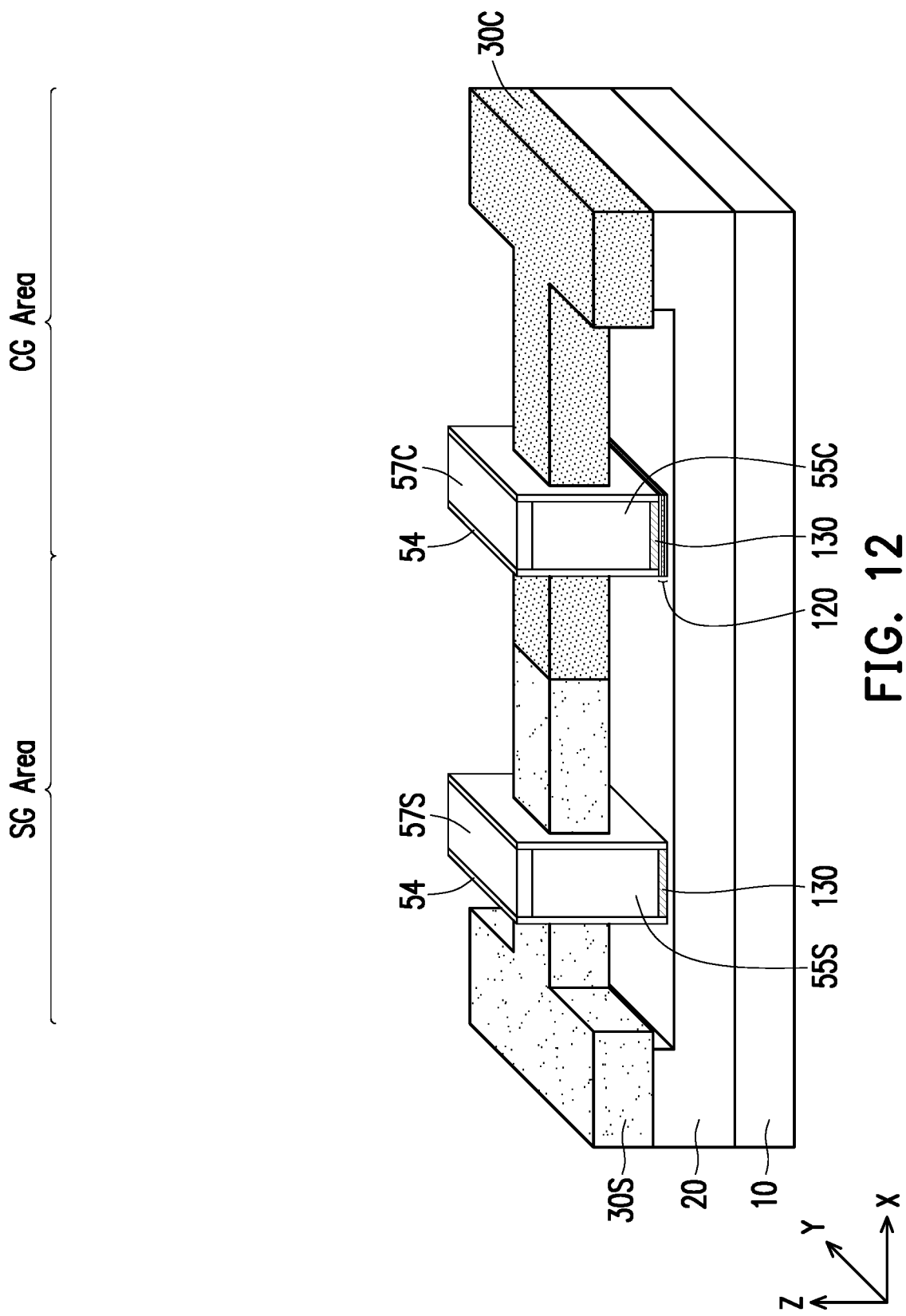
FIG. 12 illustrates one of the various stages in a semiconductor device fabrication process in accordance with embodiments of the present disclosure.
Figure 13:
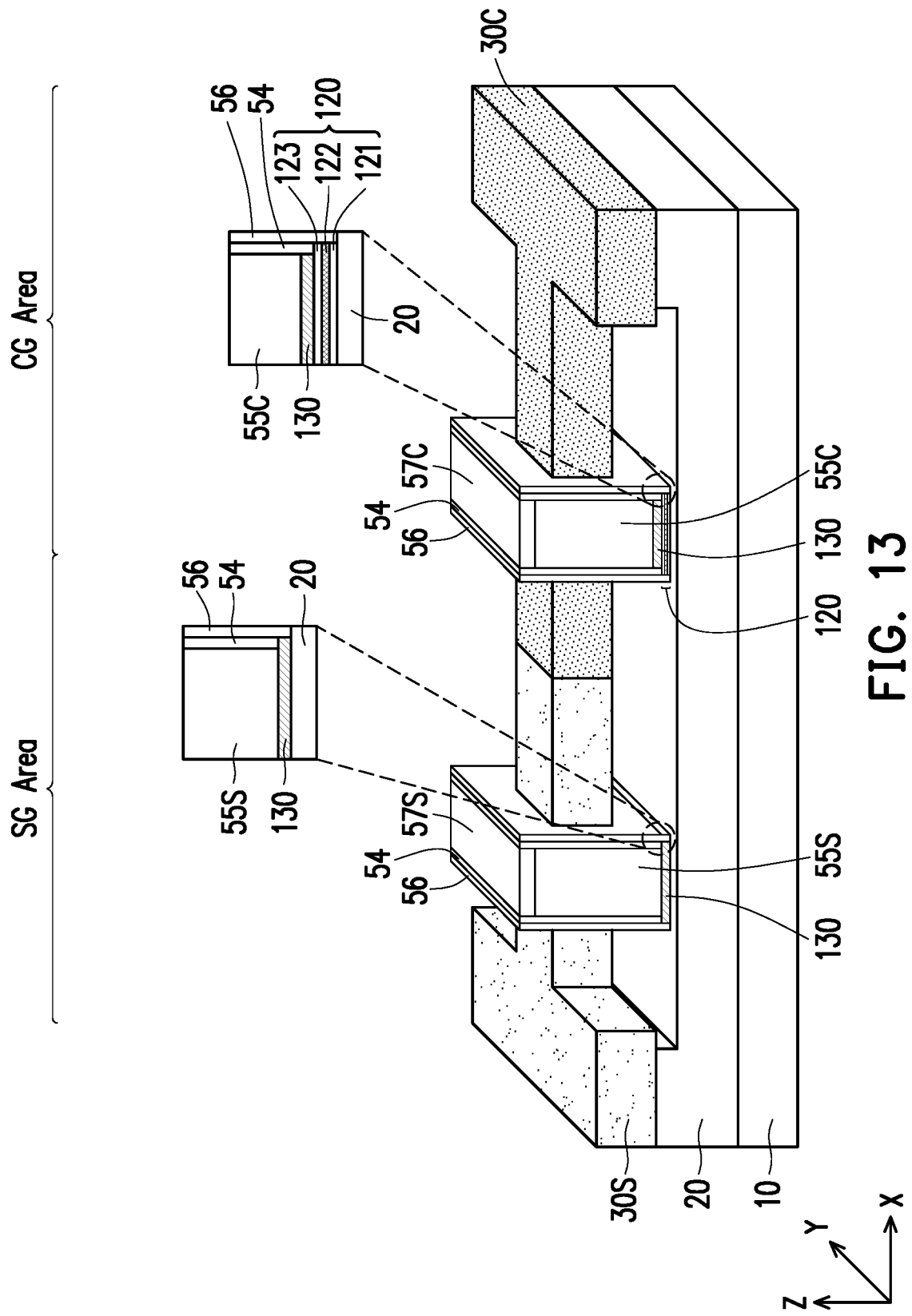
FIG. 13 illustrates one of the various stages in a semiconductor device fabrication process with enlarged views in accordance with embodiments of the present disclosure.
Figure 14:
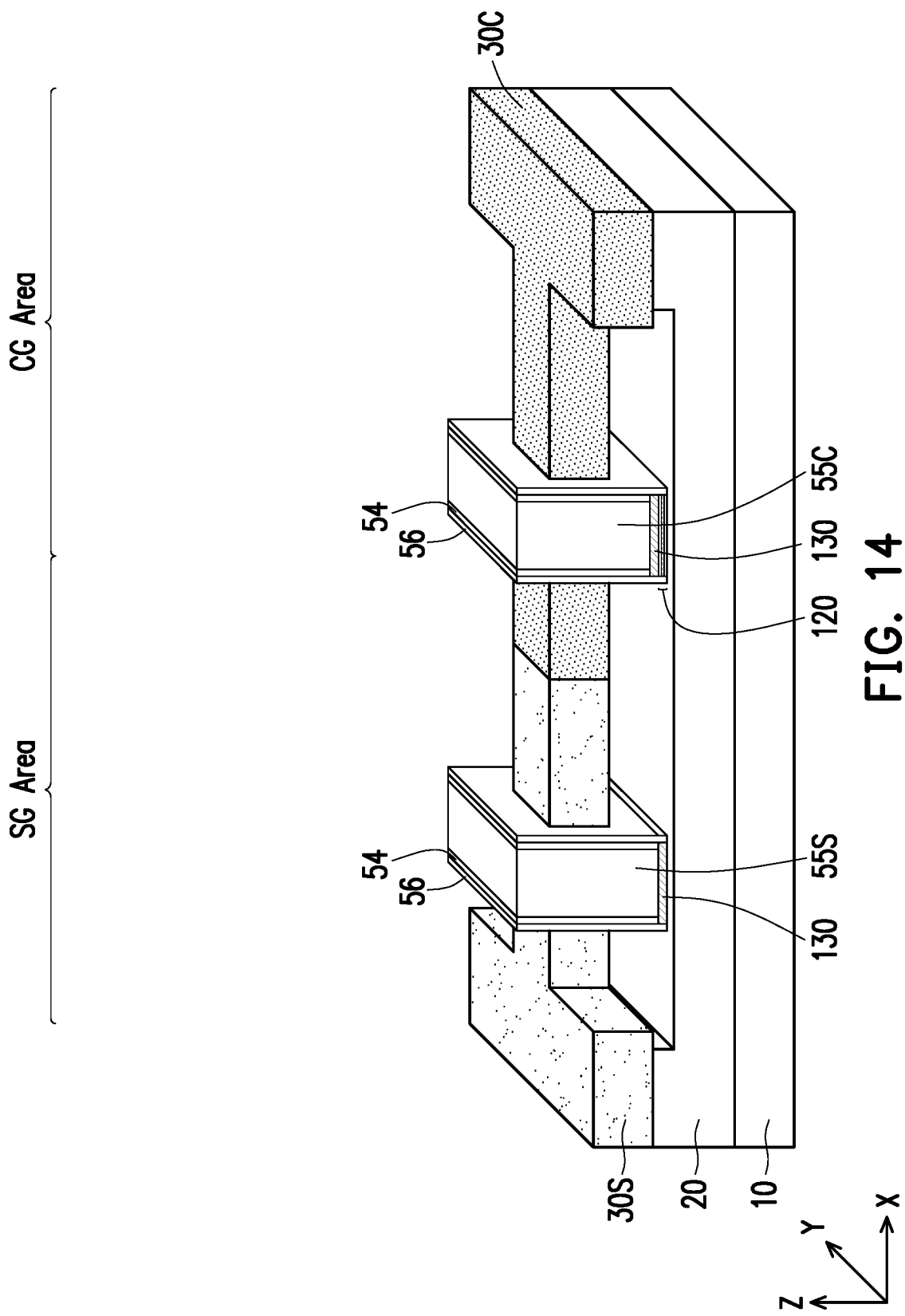
FIG. 14 illustrates one of the various stages in a semiconductor device fabrication process in accordance with embodiments of the present disclosure.

Further, as shown in FIG. 12, after the first sidewall spacers 54 are formed, the stacked dielectric layer 120, which is exposed from the control gate structure (i.e., not covered by the dummy control gate electrode and the first sidewall spacers) as shown in FIG. 11, is removed by dry and/or wet etching. Subsequently, the second sidewall spacers 56 are formed on the first sidewall spacers, as shown in FIG. 13. The sidewall spacers 56 may include one or more layers of $SiO_2$, SiN, SiON, SiOCN or other suitable dielectric material and may be formed by film forming and anisotropic etching operations. Although sidewalls may also be formed on the anchor portions 30S and 30C or other portions, such sidewalls are not illustrated in FIG. 13 for simplicity. The material of the first sidewall spacers 54 may be the same as or different from the material of the second sidewall spacers 56. The thickness of the second sidewall spacers 56 is in a range from about 5 nm to about 50 nm in some embodiments. As shown in FIG. 13, in the control gate area, the first sidewall spacer 54 is in contact with the dummy gate layer 55C, the gate dielectric layer 130 and the stacked dielectric layer 120, and the second sidewall spacer 56 is in contact with the first sidewall spacer 54, the stacked dielectric layer 120 and the insulating layer 20. In the select gate area, the first sidewall spacer 54 is in contact with the dummy gate layer 55S and the gate dielectric layer 130, and the second sidewall spacer 56 is in contact with the first sidewall spacer 54, the gate dielectric layer 130 and the insulating layer 20. Subsequently, as shown in FIG. 14, the cap layers 57S and 57C are removed by using an etching operation and/or a planarization operation, such as chemical mechanical polishing (CMP). In some embodiments, the cap layers 57S and 57C are not removed at this stage of the manufacturing operation, but rather, are removed at a later stage.

Figure 15:
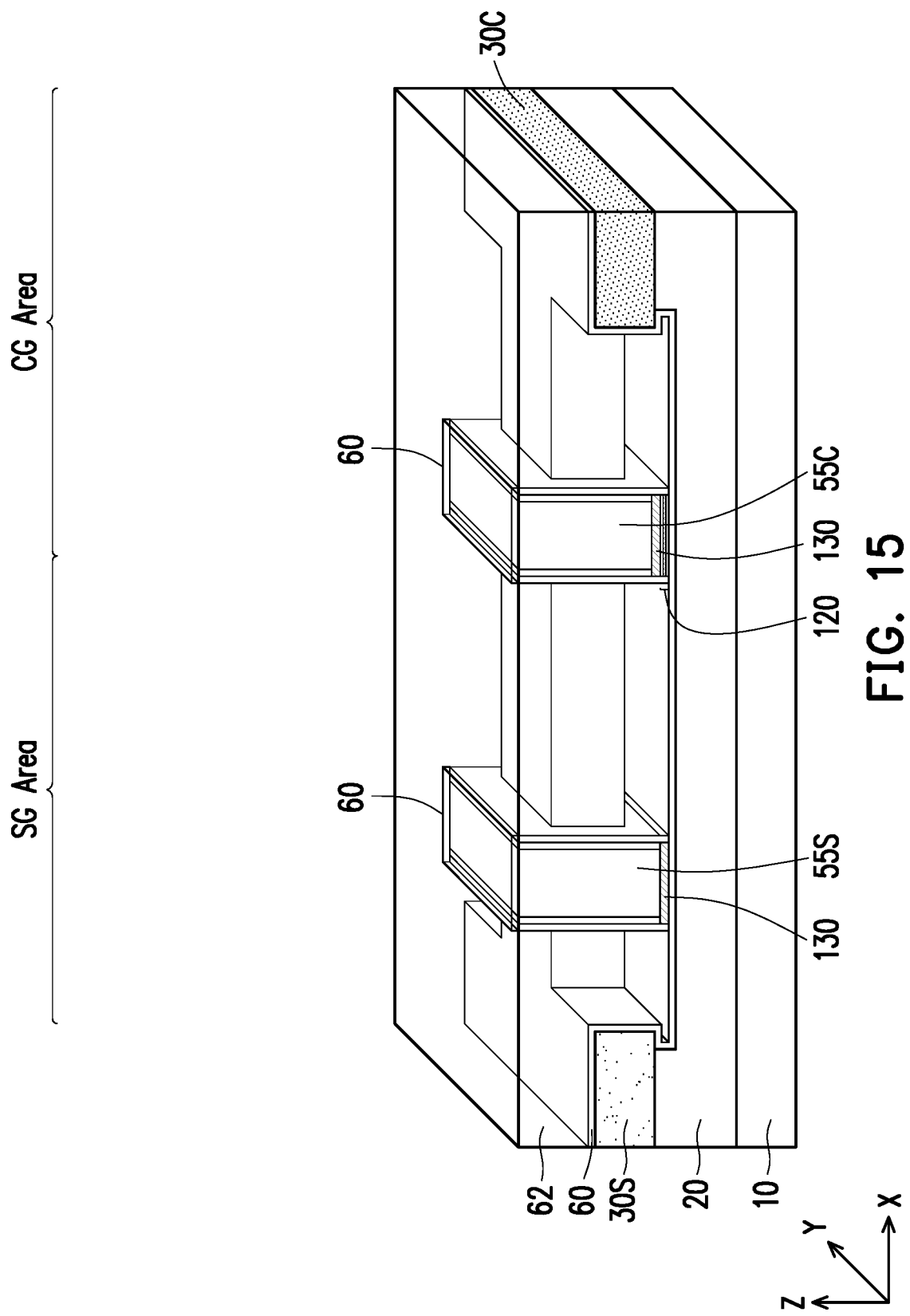
FIG. 15 illustrates one of the various stages in a semiconductor device fabrication process in accordance with embodiments of the present disclosure.

Next, as shown in FIG. 15, the BESL 60 is formed over the structure of FIG. 14, and further the ILD layer 62 is formed on the BESL 60. The thickness of the BESL 60 is in a range from about 5 nm to about 30 nm in some embodiments.

Figure 16:
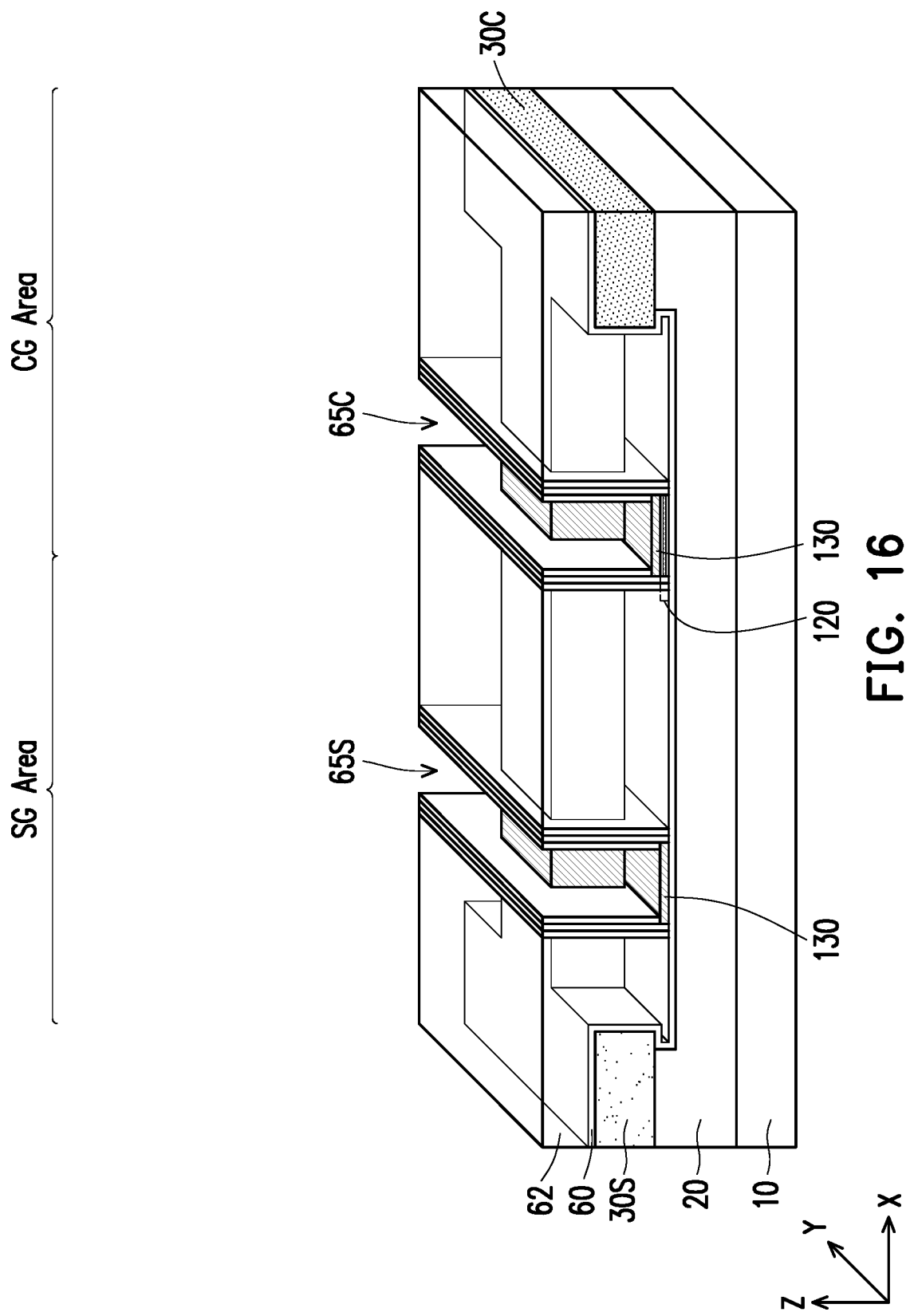
FIG. 16 illustrates one of the various stages in a semiconductor device fabrication process in accordance with embodiments of the present disclosure.

Further, a planarization operation, such as CMP, is performed to expose the upper surface of the dummy gate electrode 55S and 55C, and then the dummy gate electrode 55S and 55C are removed by dry and/wet etching, thereby forming gate spaces 65S and 65C in which the gate dielectric layer 130 is exposed, as shown in FIG. 16. The removal process may include one or more etch processes. For example in some embodiments, the removal process includes selectively etching using either dry or wet etching. When dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. When wet etching is used, the etching solution (etchant) may include $NH_4OH:H_2O_2:H_2O$ (APM), $NH_2OH$, KOH, $HNO_3$: $NH_4F:H_2O$, and/or the like. In some embodiments, the cap layers 57S and 57C are removed by the CMP at this stage.

Figure 17:
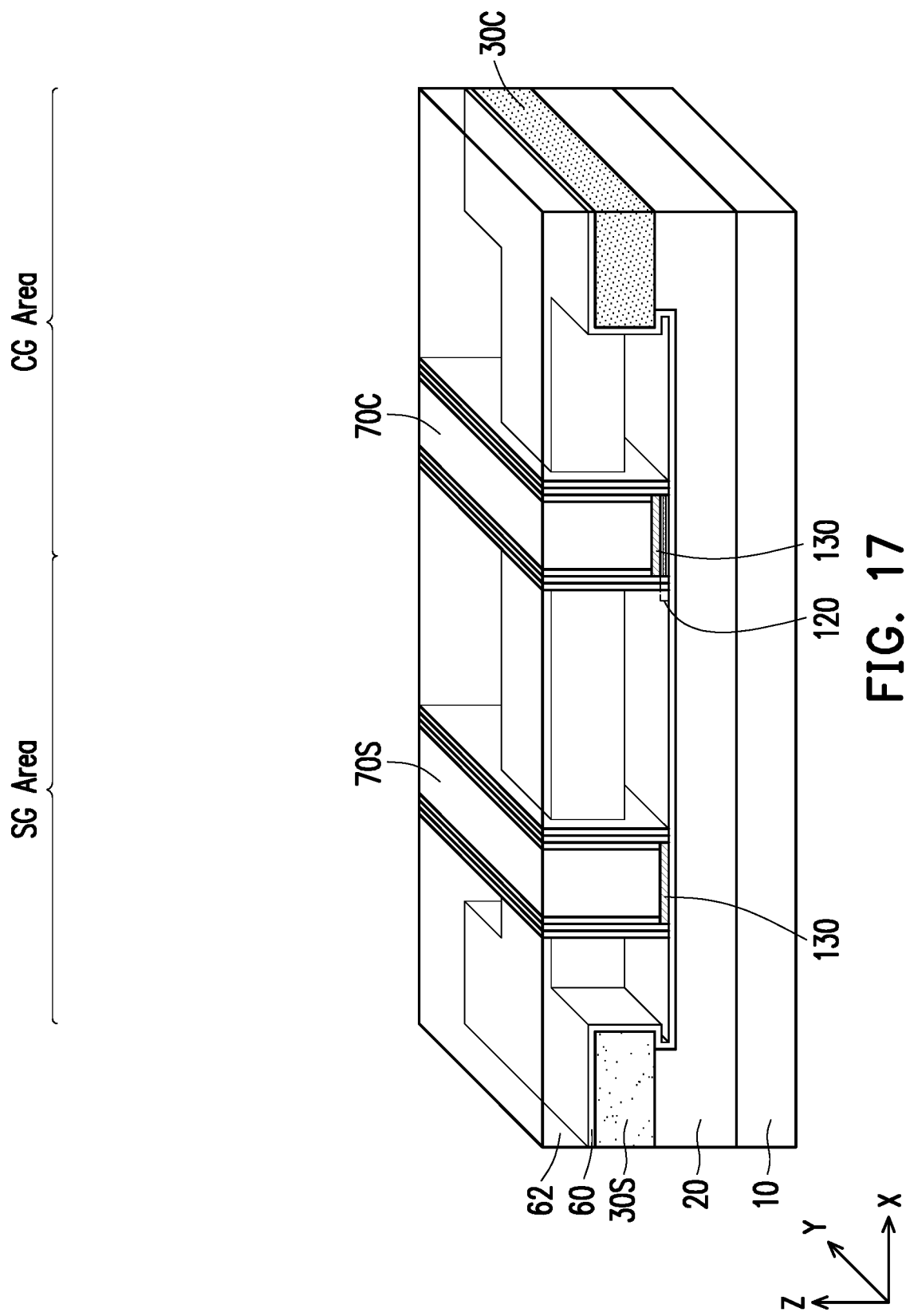
FIG. 17 illustrates one of the various stages in a semiconductor device fabrication process in accordance with embodiments of the present disclosure.

Then, one or more conductive materials are formed in the gate spaces 65S and 65C, thereby forming metal gate electrodes 70S and 70C, as shown in FIG. 17. The metal gate electrodes 70S and 70C may be formed using a suitable process such as ALD, CVD, PVD, plating, or combinations thereof. A planarization process, such as a CMP, may be performed to remove excess materials.

After forming the gate electrodes 70S and 70C, further CMOS processes are performed to form various features such as additional interlayer dielectric layers, contacts/vias, interconnect metal layers, and passivation layers, etc.

FIGS. 18-22 illustrate various stages of a semiconductor device fabrication process in accordance with other embodiments of the present disclosure. It is understood that additional operations can be provided before, during, and after processes shown by FIGS. 18-22, and some of the operations described below can be replaced or eliminated, for additional embodiments of the method. The order of the operations/processes may be interchangeable. Materials, configuration, processes and/or operations same as or similar to those explained with respect to FIGS. 1A-17 may be applied to the following embodiments, and the detailed explanation thereof may be omitted to avoid redundancy. FIGS. 18-22 show another process to form the semiconductor wire.

Figure 18:
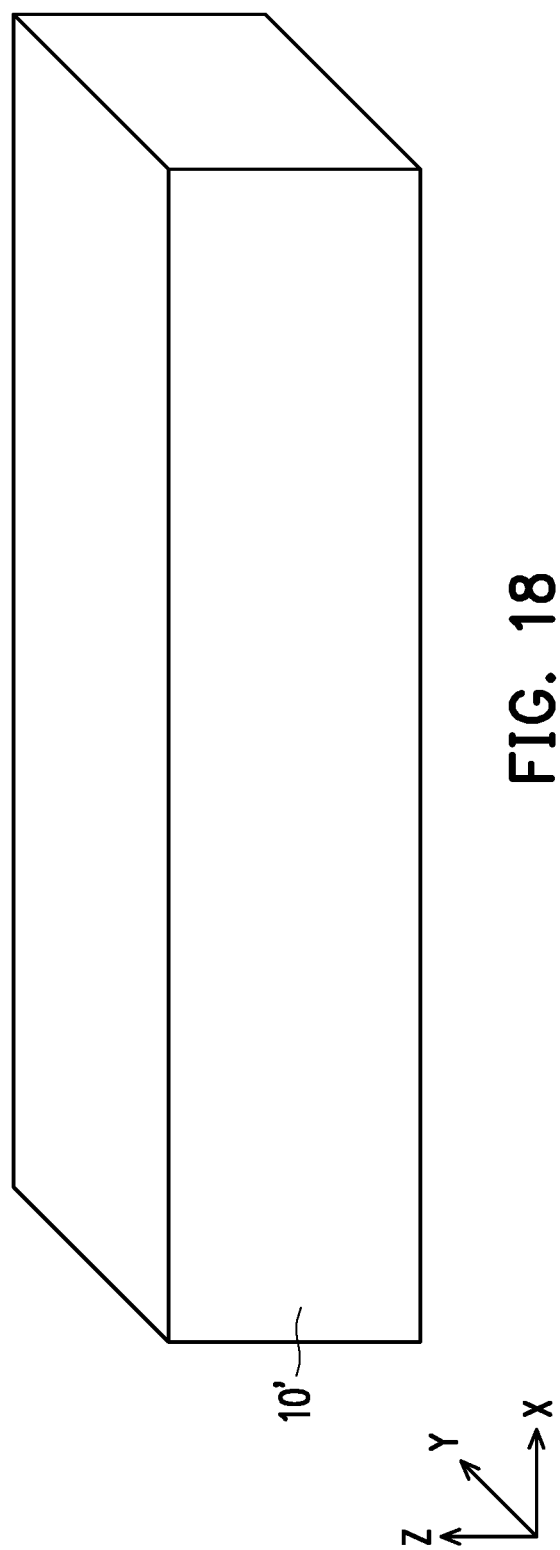
FIG. 18 illustrates one of the various stages in a semiconductor device fabrication process in accordance with other embodiments of the present disclosure.
Figure 19:
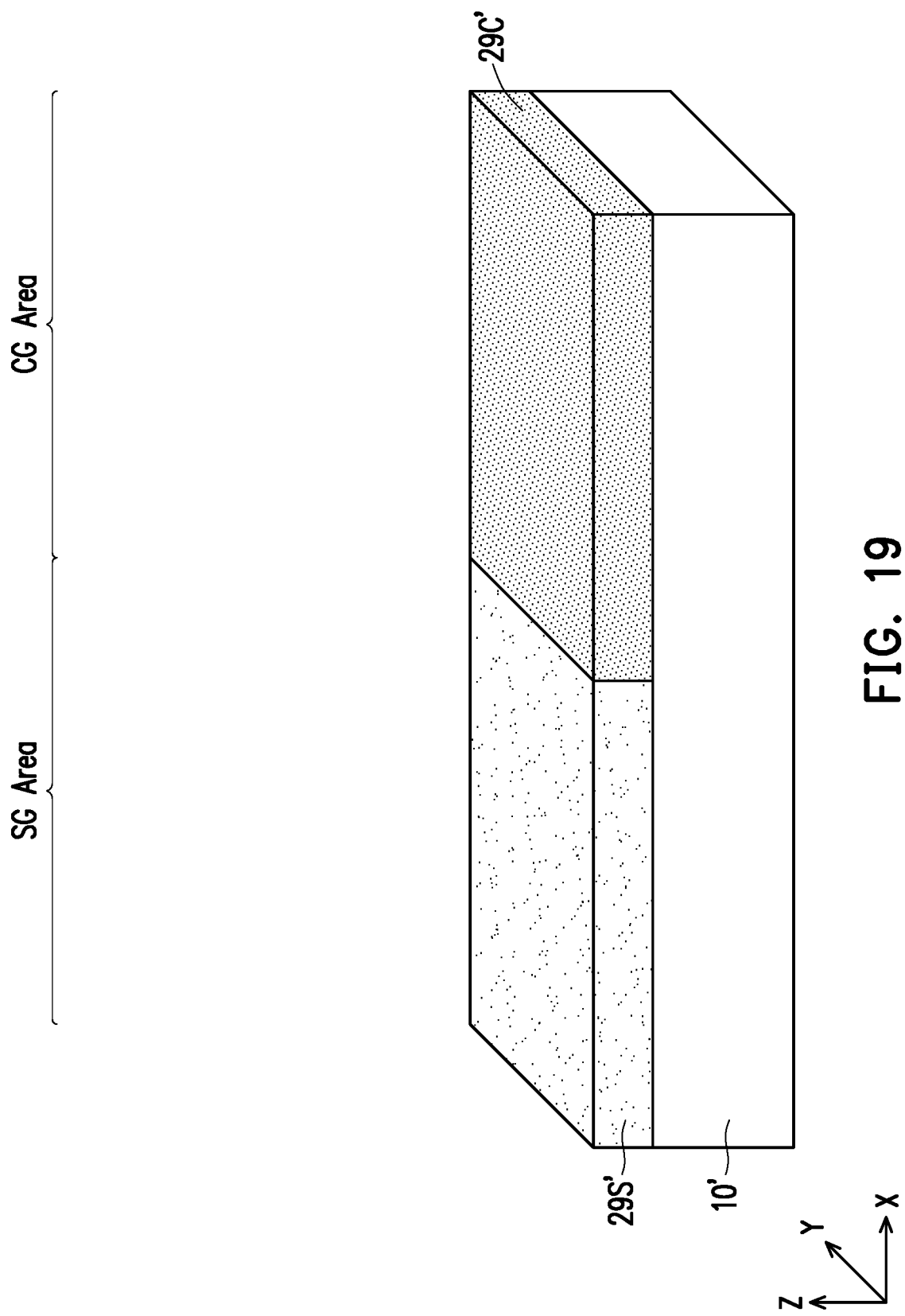
FIG. 19 illustrates one of the various stages in a semiconductor device fabrication process in accordance with other embodiments of the present disclosure.
Figure 20:
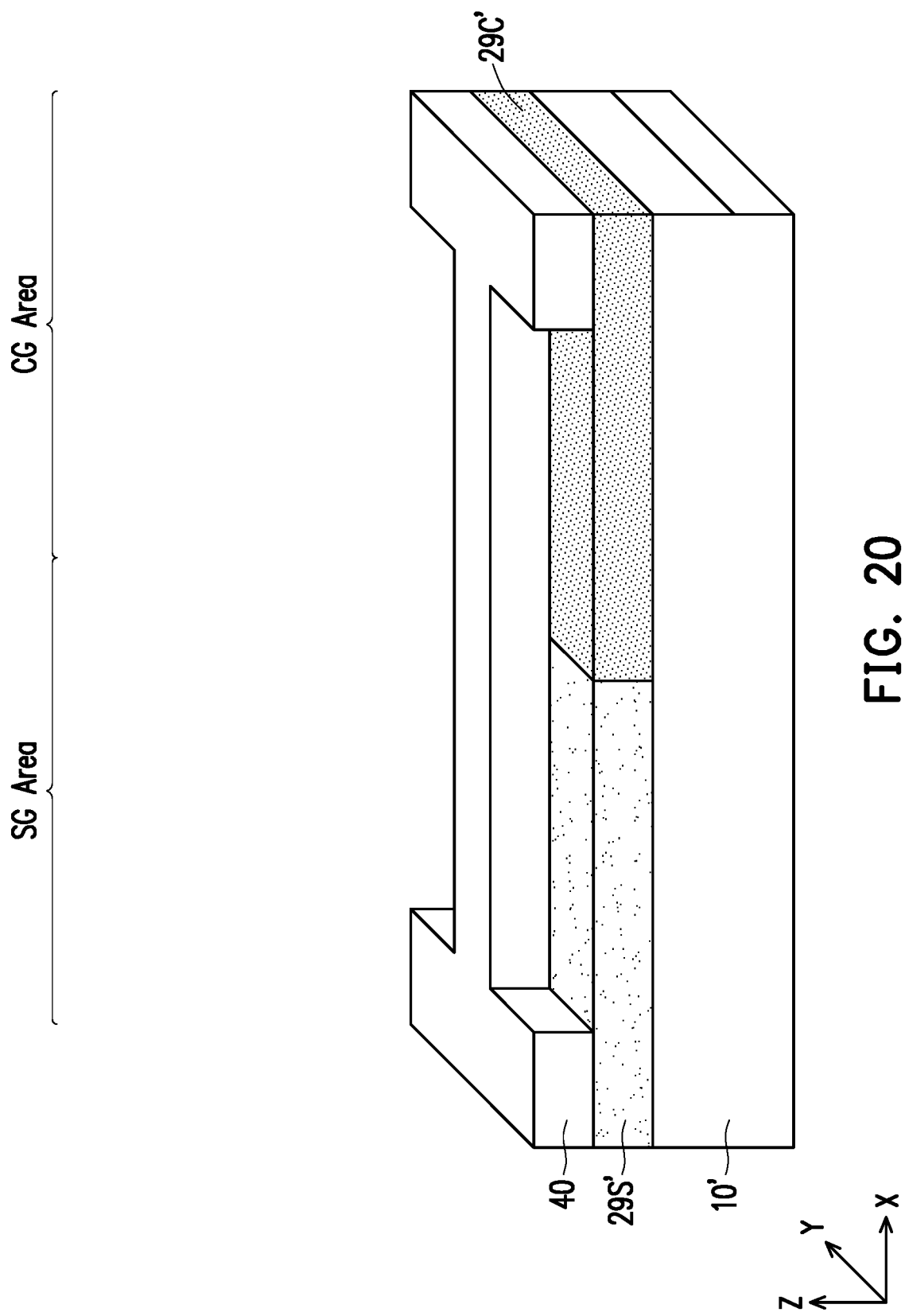
FIG. 20 illustrates one of the various stages in a semiconductor device fabrication process in accordance with other embodiments of the present disclosure.

As show in FIG. 18, a substrate (e.g., a Si wafer) 10' is prepared. The substrate 10' may be made of Ge, Group-IV compound semiconductors or Group III-V compound semiconductors, or the like. Then, similar to the operations of FIG. 3, impurities are introduced in a select gate area and a control gate area, respectively, thereby forming a select gate (SG) well layer 29S' and a control gate (CG) well layer 29C', as shown in FIG. 19. Similar to FIG. 4, a mask pattern 40 is formed over the select gate well layer 29S' and the control gate well layer 29C', as shown in FIG. 20.

Figure 21:
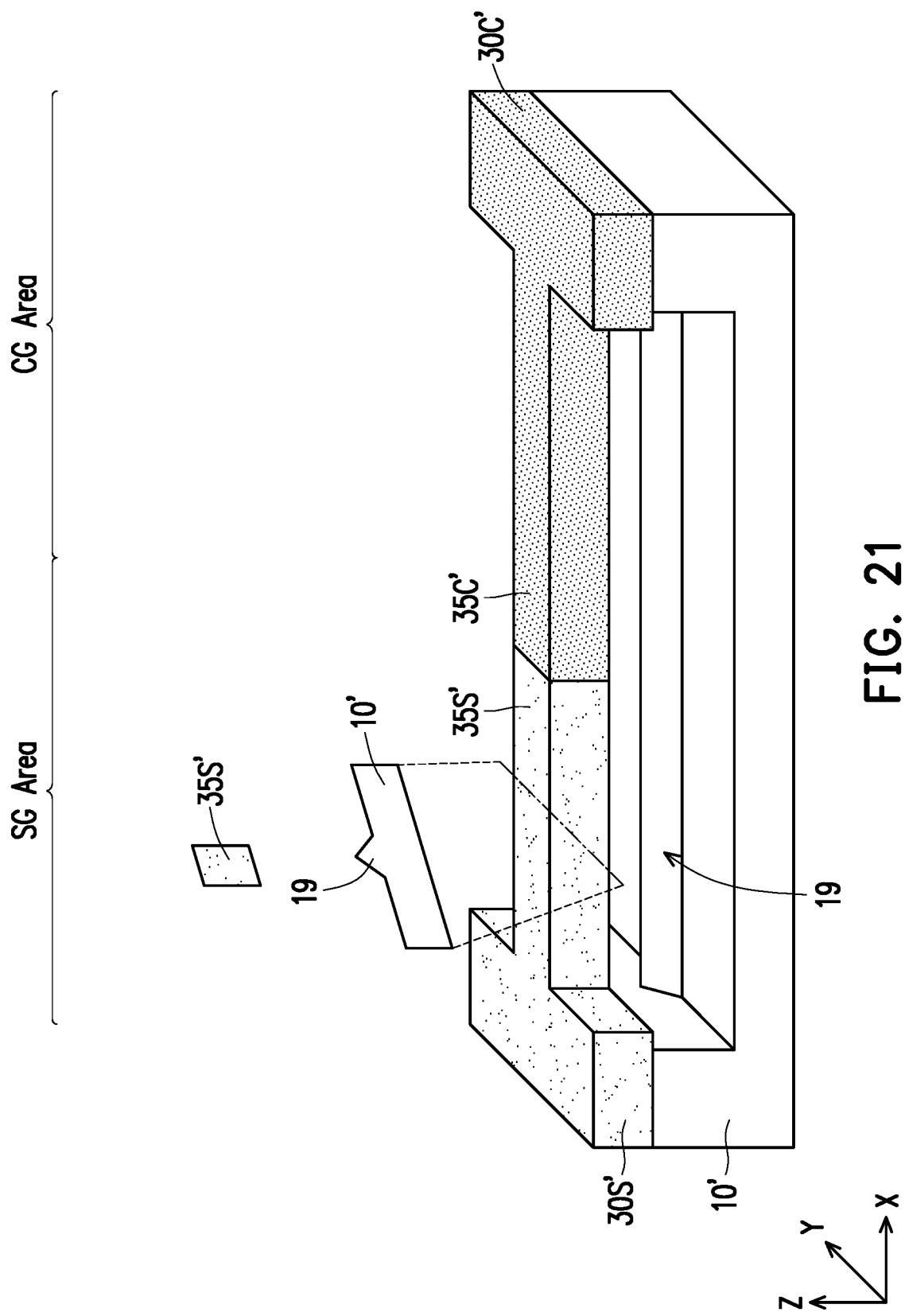
FIG. 21 illustrates one of the various stages in a semiconductor device fabrication process with a cross sectional view in accordance with other embodiments of the present disclosure.

Then, the well layers 29S' and 29C' and the substrate 10' are etched to form the semiconductor wire 35S' and 35C' and anchor portions 30S' and 30C', as shown in FIG. 21. To form the semiconductor wire, a combination of anisotropic and isotropic etching is used. In the anisotropic etching, a combination of an isotropic etching operation of silicon using $SF_6$ and a sidewall passivation step using $C_4F_8$ is utilized. These two steps are repeated to form a vertical recess, followed by the isotropic etching using $SF_6$. Since the etching using $SF_6$ proceeds along the lateral direction as well as the vertical direction, portion of the substrate 10' under the mask pattern (under the semiconductor wire to be formed) is removed, thereby releasing the semiconductor wire from the substrate 10'. In some embodiments, a protrusion 19 may be formed under the semiconductor wire 35S' and 35C', as shown in FIG. 21 with a cross sectional view.

Figure 22:
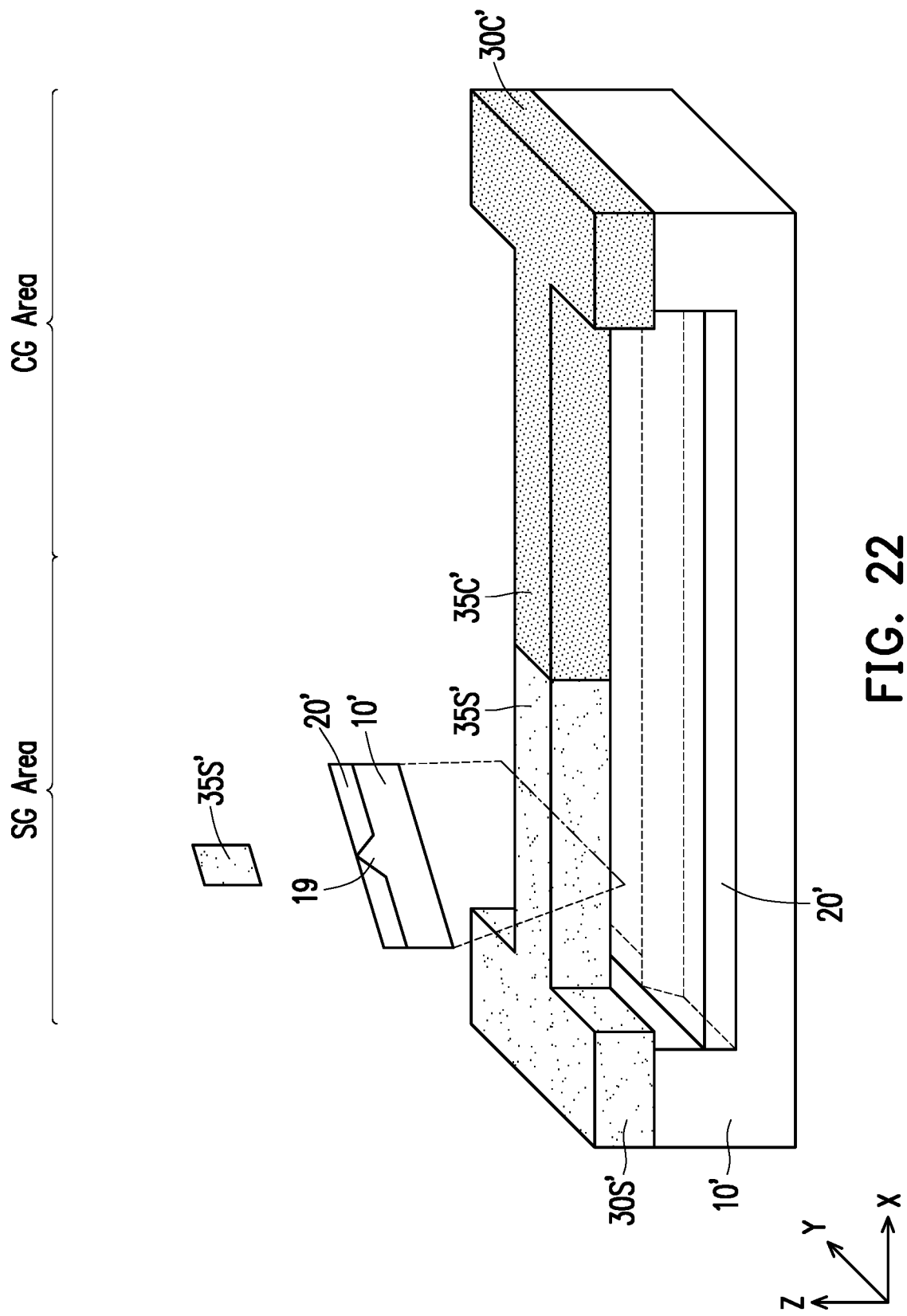
FIG. 22 illustrates one of the various stages in a semiconductor device fabrication process with a cross sectional view in accordance with other embodiments of the present disclosure.

Subsequently, an insulating layer 20' is formed in the recessed substrate 10', as shown in FIG. 22. The isolation insulating layer 20' may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 20' is formed through a process such as CVD, flowable CVD (FCVD), or a spin-on-glass process, although any acceptable process may be utilized. Subsequently, unnecessary portions of the isolation insulating layer 20' are removed using, for example, an etch process, chemical mechanical polishing (CMP), or the like. After the insulating layer 20' is formed, the operations for forming the NVM cell structure as explained with FIGS. 6-17 are performed.

FIGS. 23-26 illustrate various stages of a semiconductor device fabrication process in accordance with other embodiments of the present disclosure. It is understood that additional operations can be provided before, during, and after processes shown by FIGS. 23-26, and some of the operations described below can be replaced or eliminated, for additional embodiments of the method. The order of the operations/processes may be interchangeable. Materials, configurations, processes and/or operations same as or similar to those explained with respect to FIGS. 1A-22 may be applied to the following embodiments, and the detailed explanation thereof may be omitted to avoid redundancy. FIGS. 23-26 show another process to form the semiconductor wire.

Figure 23:
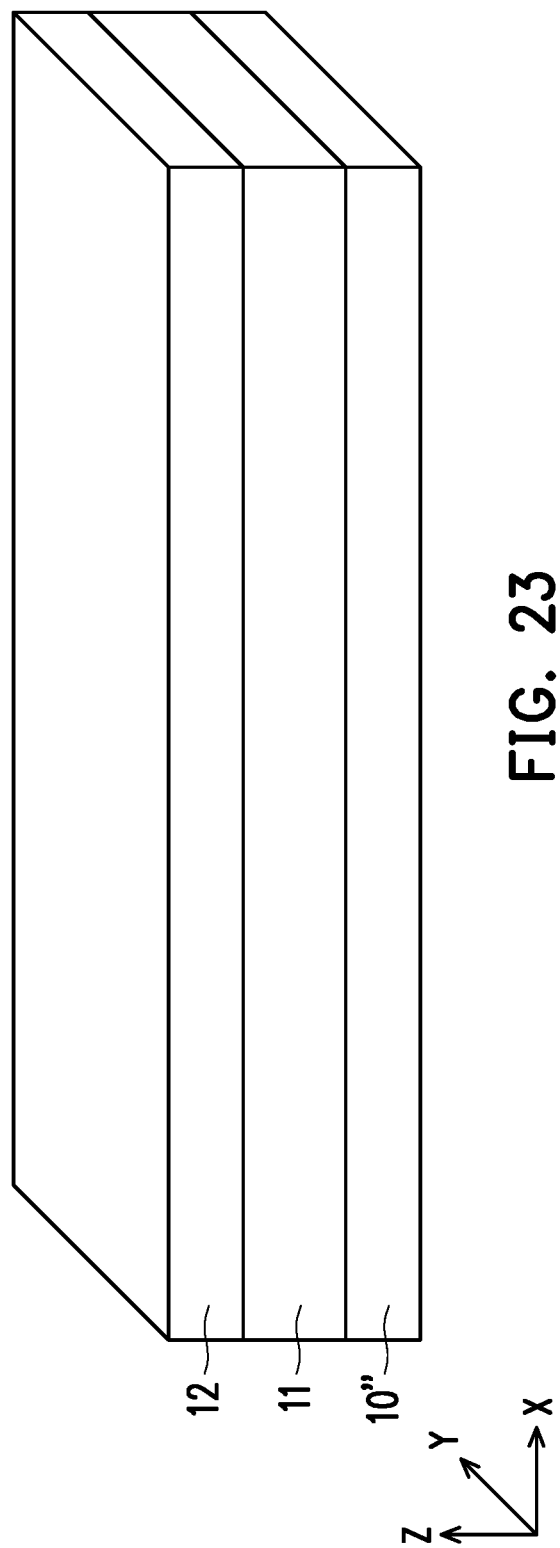
FIG. 23 illustrates one of the various stages in a semiconductor device fabrication process in accordance with other embodiments of the present disclosure.

As shown in FIG. 23, a first semiconductor layer 11 is epitaxially formed on a substrate 10" and a second semiconductor layer 12 is epitaxially formed on the first semiconductor layer 11. In some embodiments, the substrate 10" is Si, the first semiconductor layer 11 is made of SiGe, and the second semiconductor layer 12 is made of Si.

Figure 24:
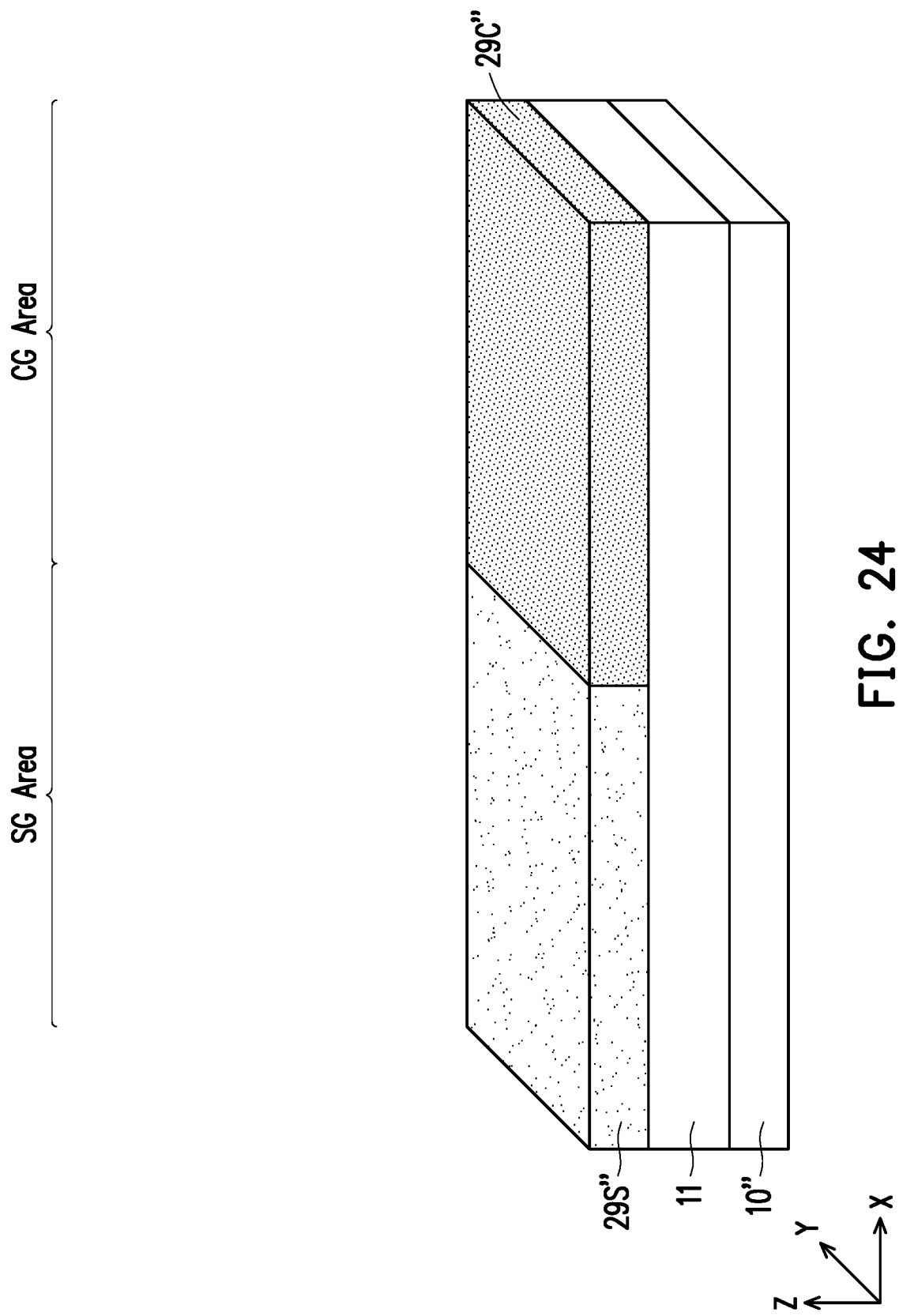
FIG. 24 illustrates one of the various stages in a semiconductor device fabrication process in accordance with other embodiments of the present disclosure.
Figure 25:
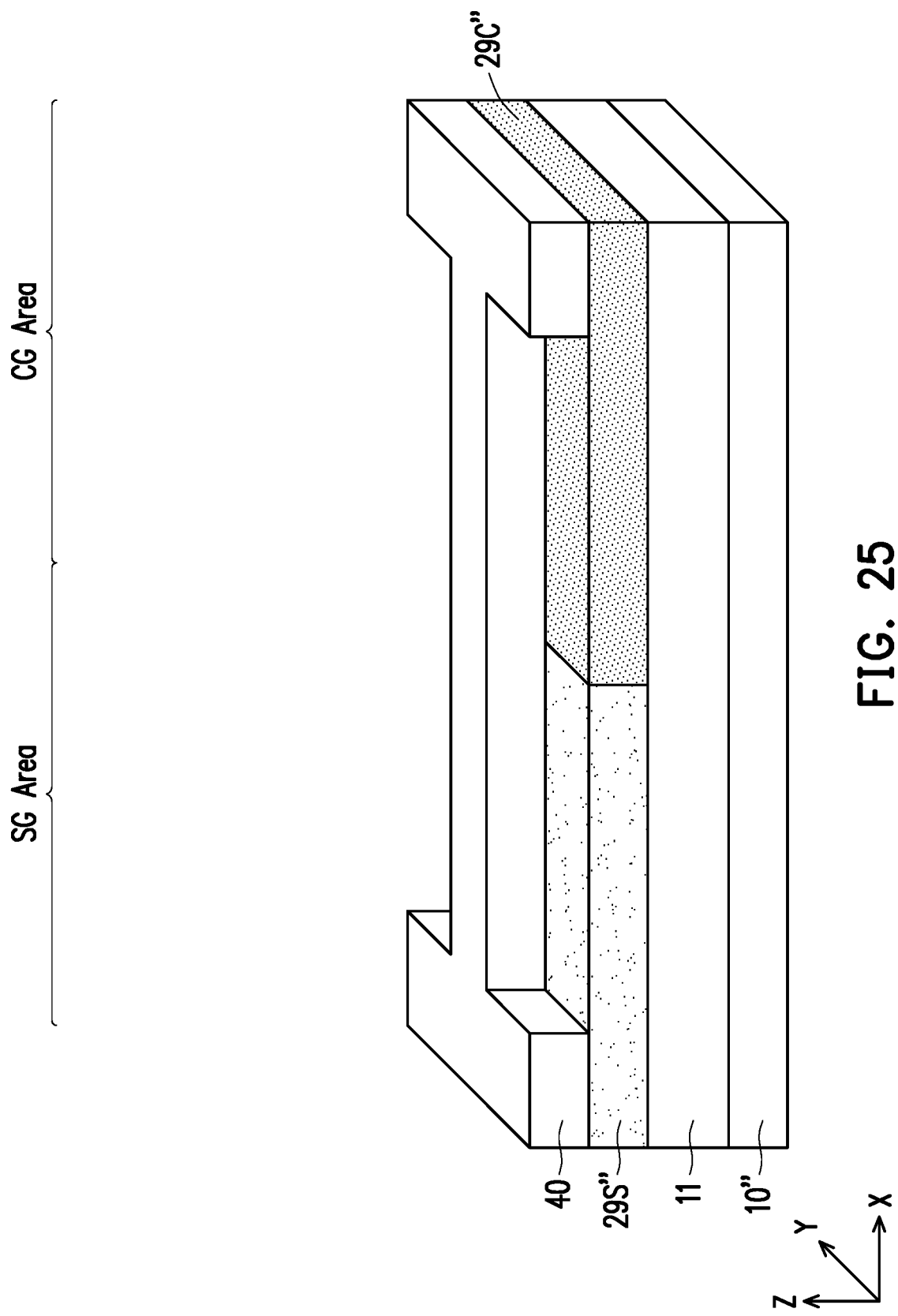
FIG. 25 illustrates one of the various stages in a semiconductor device fabrication process in accordance with other embodiments of the present disclosure.

Then, similar to the operations of FIG. 3, impurities are introduced in a select gate area and a control gate area, respectively, thereby forming a select gate (SG) well layer 29S" and a control gate (CG) well layer 29C", as shown in FIG. 24. Similar to FIG. 4, a mask pattern 40 is formed over the select gate well layer 29S" and the control gate well layer 29C", as shown in FIG. 25.

Figure 26:
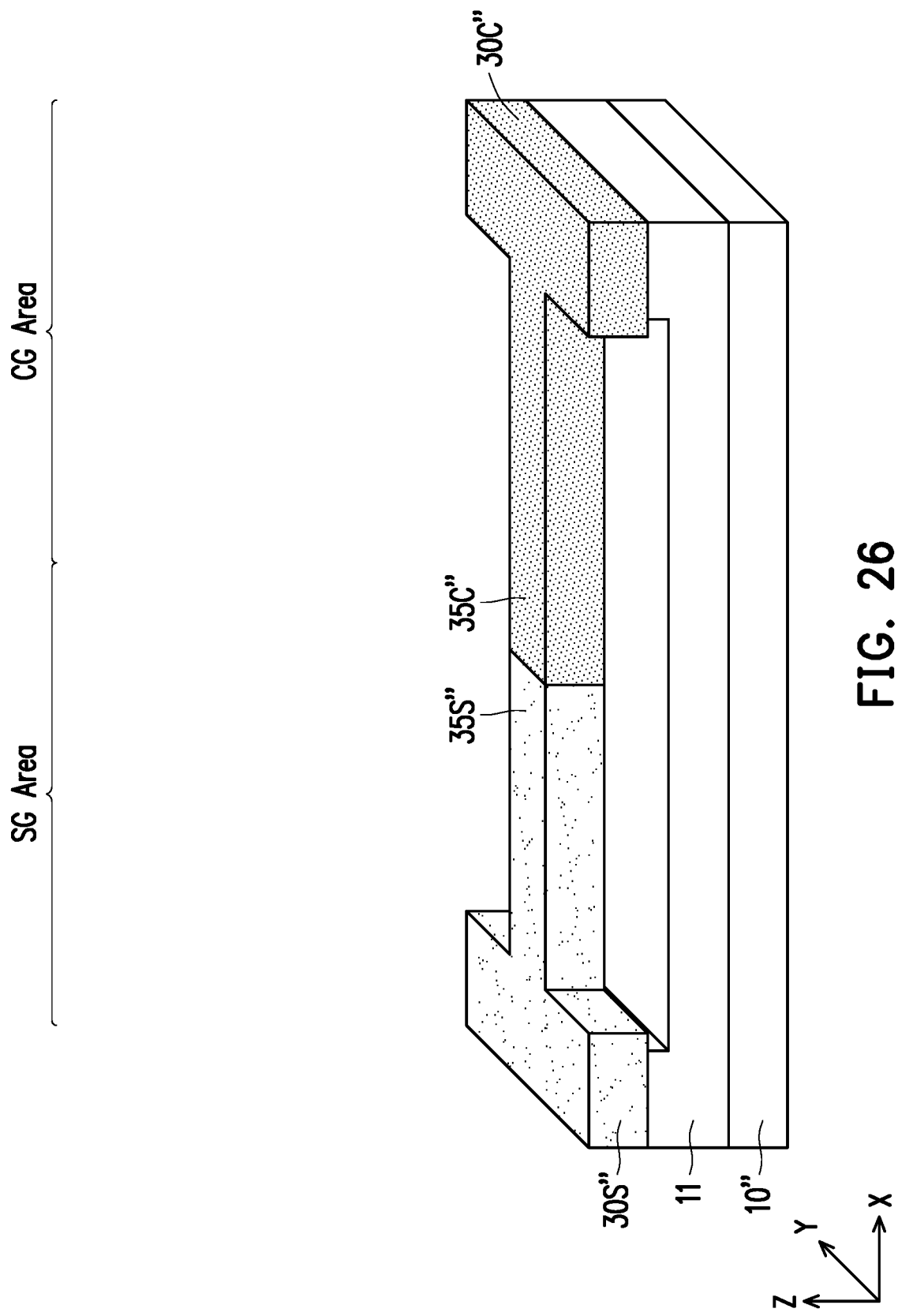
FIG. 26 illustrates one of the various stages in a semiconductor device fabrication process in accordance with other embodiments of the present disclosure.

Then, the well layers 29S" and 29C" and the substrate 10" are etched to form the semiconductor wire 35S" and 35C" and anchor portions 30S" and 30C", as shown in FIG. 26. To form the semiconductor wire, the second semiconductor layer 12 is etched by using the mask pattern 40 as an etching mask, and then part of the first semiconductor layer 11 is removed. The first semiconductor layer 11 may be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

In some embodiments, a protrusion similar to the protrusion 19 shown in FIG. 21 may be formed under the semiconductor wire 35S" and 35C".

Subsequently, similar to FIG. 11, an insulating layer is formed in the recessed first semiconductor layer 11. In some embodiments, the first semiconductor layer under the semiconductor wire 35S" and 35C" is fully removed to expose the substrate 10". After the insulating layer is formed, the operations for forming the NVM cell structure as explained with FIGS. 6-17 are performed.

FIGS. 27-30 illustrate various stages of a semiconductor device fabrication process in accordance with other embodiments of the present disclosure. It is understood that additional operations can be provided before, during, and after processes shown by FIGS. 27-30, and some of the operations described below can be replaced or eliminated, for additional embodiments of the method. The order of the operations/processes may be interchangeable. Materials, configuration, processes and/or operations same as or similar to those explained with respect to FIGS. 1A-26 may be applied to the following embodiments, and the detailed explanation thereof may be omitted to avoid redundancy.

FIGS. 27-30 show another process to form the metal gate structures. In the embodiments with respect to FIGS. 2-17, a high-k gate dielectric layer 130 is first formed and a dummy gate layer is formed on the high-k gate dielectric layer 130. In the following embodiments, a dummy gate dielectric layer 135 is formed instead of the gate dielectric layer 130, and the high-k gate dielectric layer 130 is subsequently formed.

Figure 27:
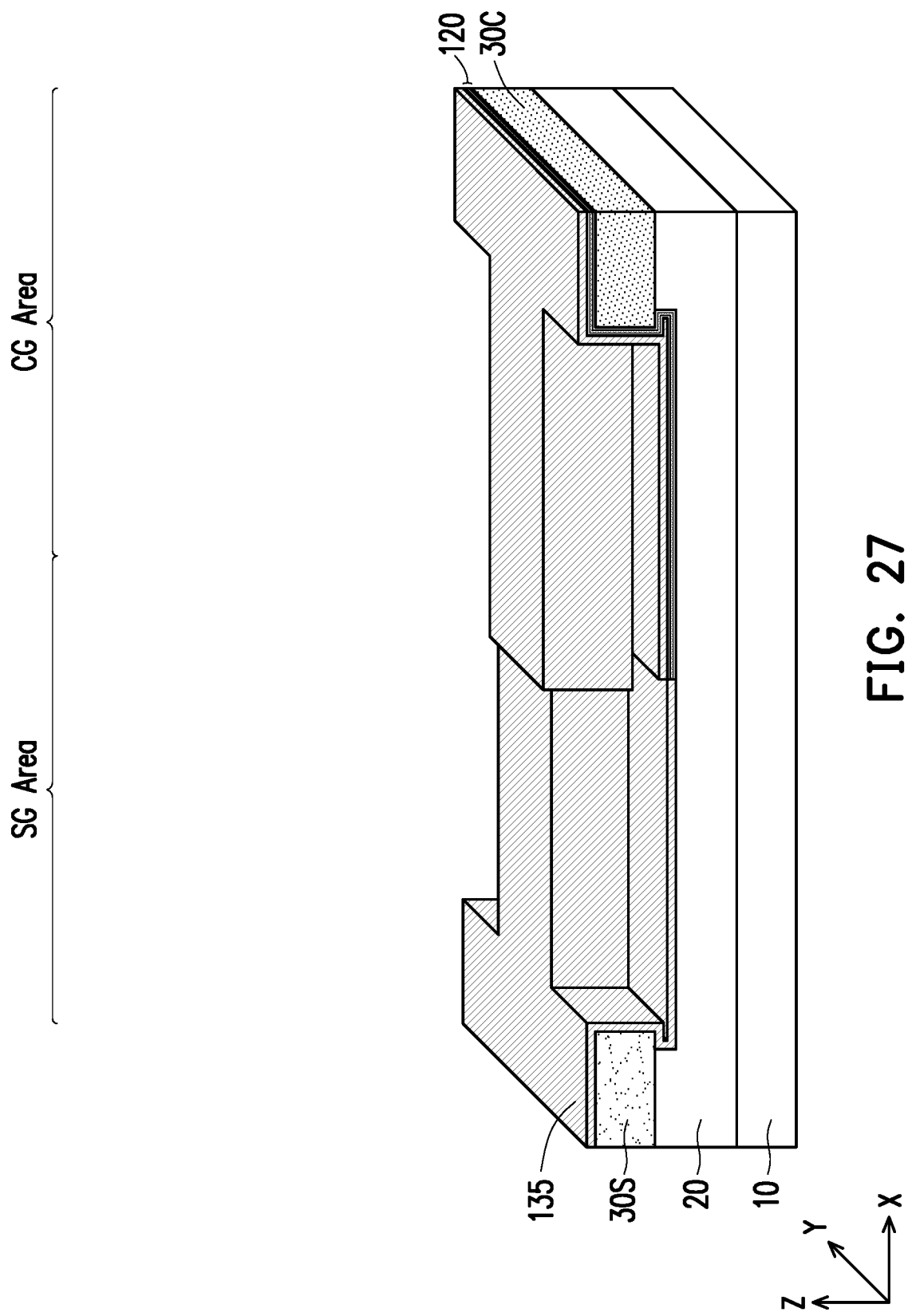
FIG. 27 illustrates one of the various stages in a semiconductor device fabrication process in accordance with other embodiments of the present disclosure.

As shown in FIG. 27, after the structure of FIG. 7 is formed, a dummy gate dielectric layer 135 is formed. The dummy dielectric layer may be formed by thermal oxidation, CVD, sputtering, or any other methods known and used in the art for forming a dummy dielectric layer. In some embodiments, the dummy dielectric layer may be made of one or more suitable dielectric materials such as silicon oxide, silicon nitride, SiCN, SiON, and SiN, low-k dielectrics such as carbon doped oxides, extremely low-k dielectrics such as porous carbon doped silicon dioxide, a polymer such as polyimide, the like, or a combination thereof. In one embodiment, the dummy gate dielectric layer 135 is made of $SiO_2$ having a thickness in a range from about 2 nm to about 20 nm in some embodiments.

Figure 28:
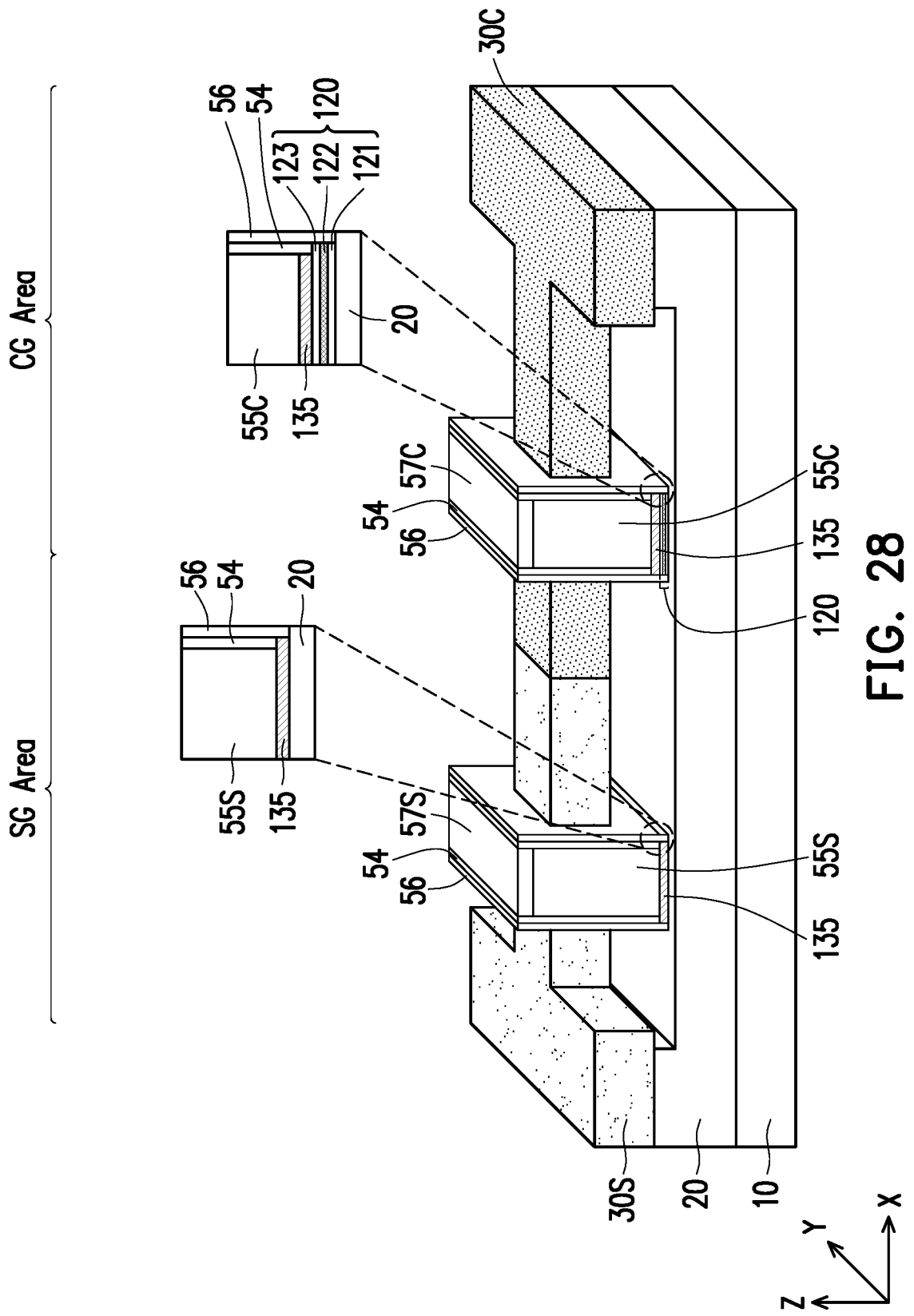
FIG. 28 illustrates one of the various stages in a semiconductor device fabrication process with enlarged views in accordance with other embodiments of the present disclosure.

After the dummy gate dielectric layer 135 is formed, the operations explained with FIGS. 9-13, are performed, thereby forming the structure of FIG. 28, which is substantially the same as the structure of FIG. 13 except for the gate dielectric layer 130 and the dummy gate dielectric layer 135.

Figure 29:
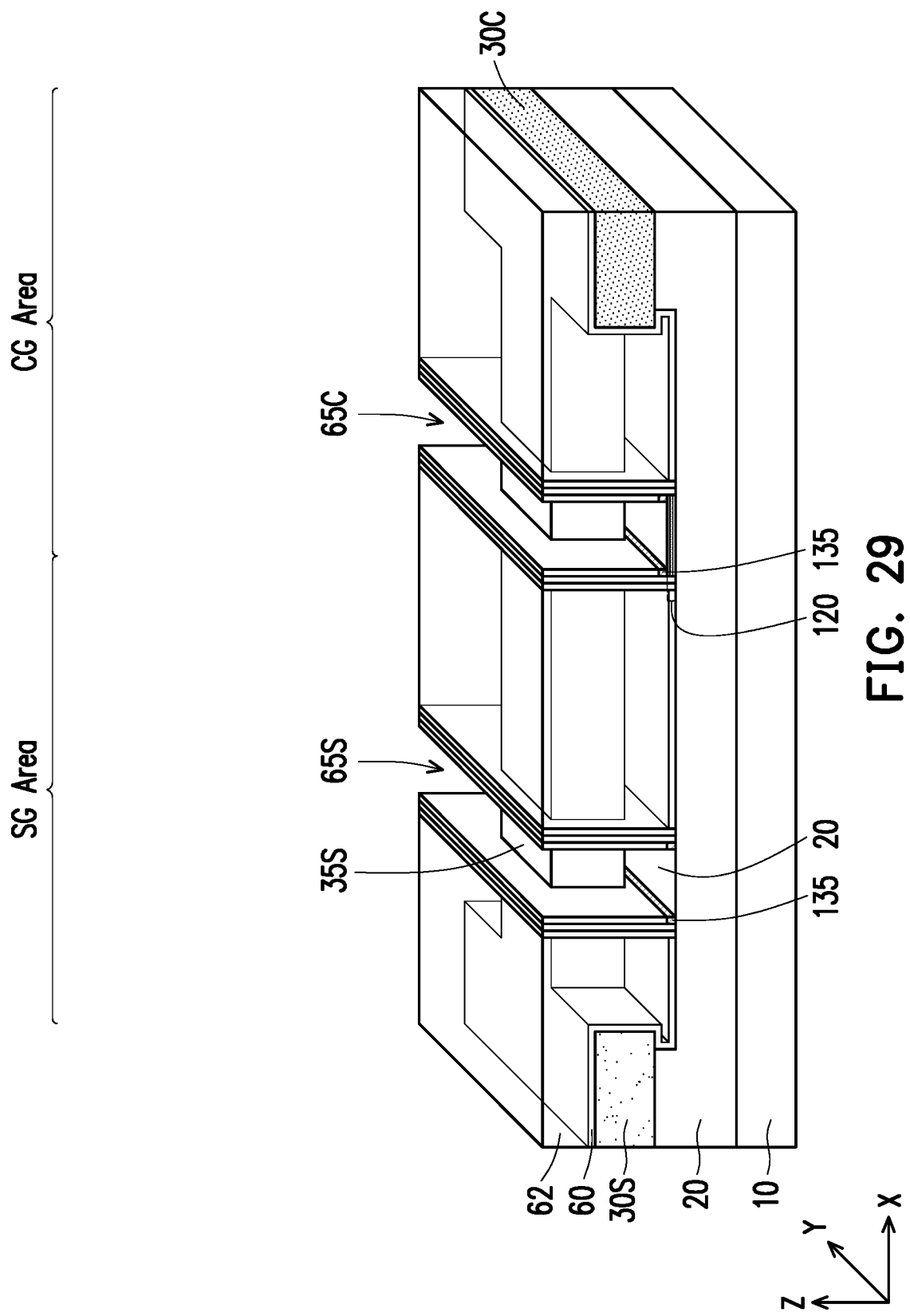
FIG. 29 illustrates one of the various stages in a semiconductor device fabrication process in accordance with other embodiments of the present disclosure.

Then, as shown in FIG. 29, the dummy gate electrode layers 55S and 55C are removed by the similar operations as explained with FIG. 16. Further, the dummy gate dielectric layer 135 is also removed, thereby forming the gate spaces 65S and 65S, in which the semiconductor wire 35S and the semiconductor wire 35C wrapped with the stacked dielectric layer 120 are exposed.

Figure 30A:
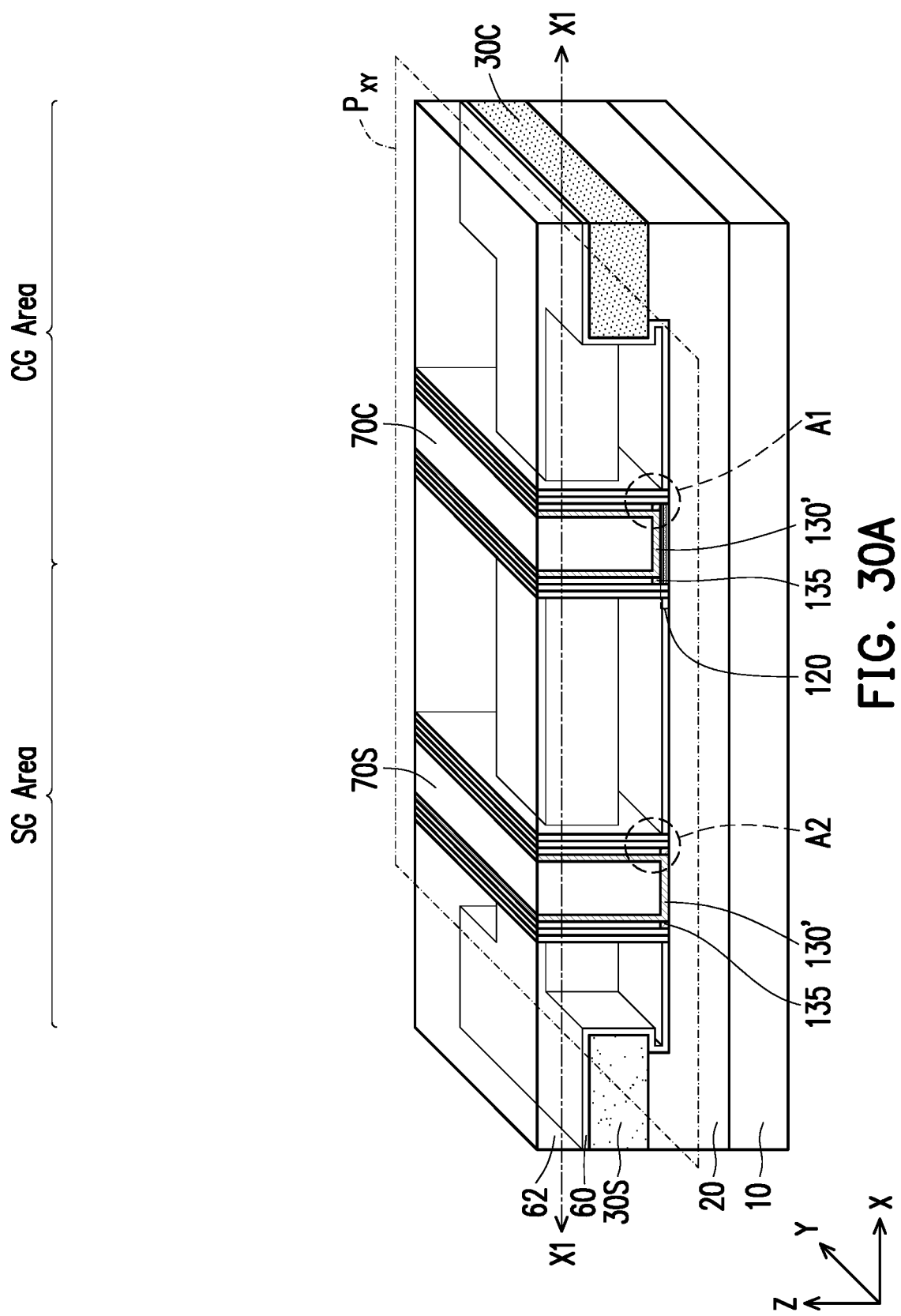
FIG. 30A illustrates one of the various stages in a semiconductor device fabrication process in accordance with other embodiments of the present disclosure.

Next, as shown in FIG. 30A, a high-k gate dielectric layer 130' is formed in the gate spaces 65S and 65C, and one or more conductive materials are formed on the gate dielectric layer 130' in the gate spaces 65S and 65C, thereby forming metal gate electrodes 70S and 70C, as shown in FIG. 30A. The metal gate electrodes 70S and 70C may be formed using a suitable process such as ALD, CVD, PVD, plating, or combinations thereof. A planarization process, such as a CMP, may be performed to remove excess materials. In some embodiments, an interfacial oxide layer is formed on the semiconductor wire 35S before forming the high-k gate dielectric layer 130'. The gate dielectric layer 130' may be formed by CVD, PVD or ALD.

Figure 30B:
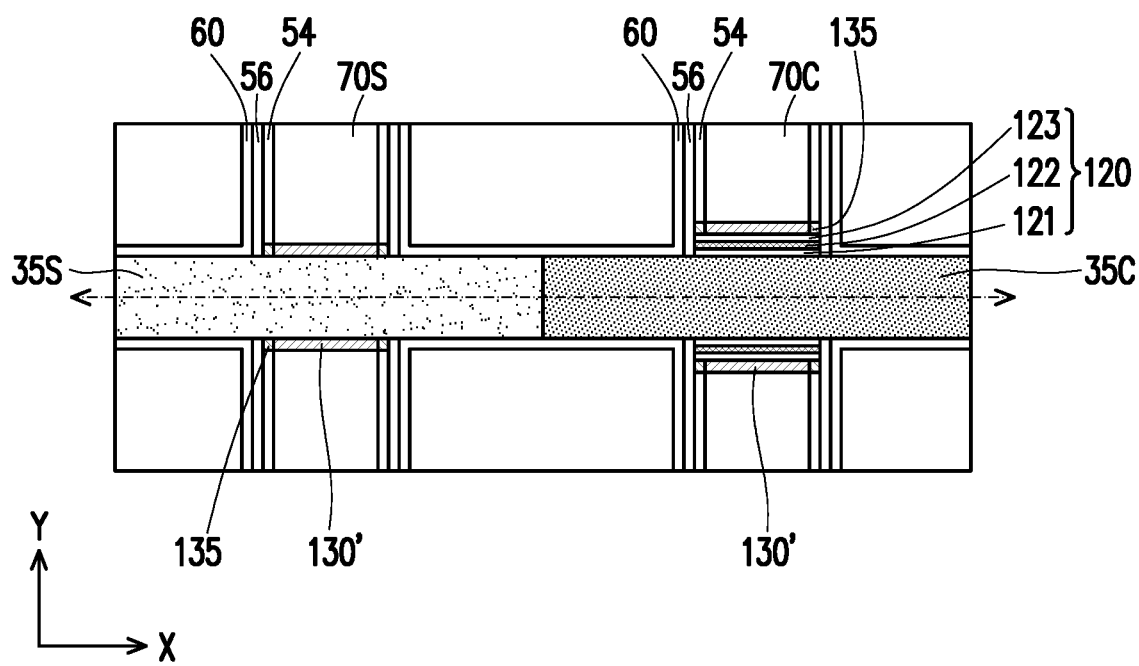
FIG. 30B is a cross sectional view corresponding to the plane $P_{XY}$ along X1-X1 line of FIG. 30A.
Figures 30C, 30D:
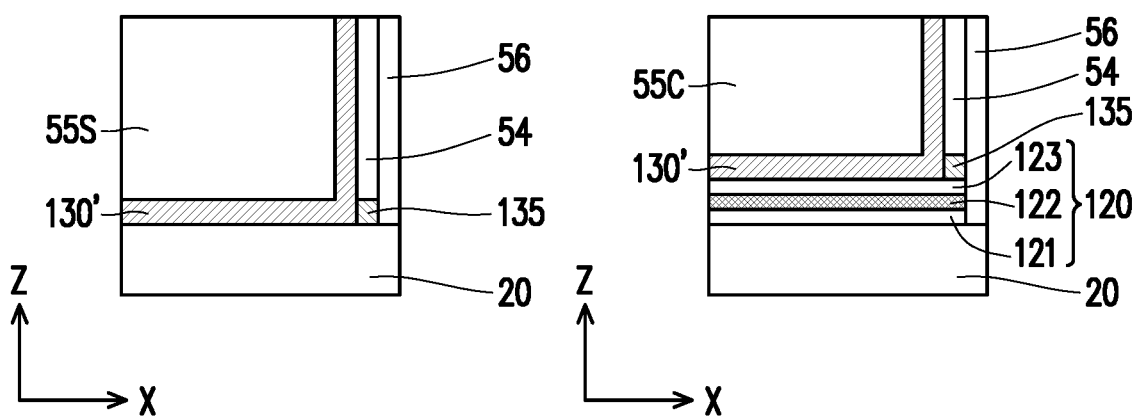
FIG. 30C is an enlarged view of area A2 of FIG. 30A
FIG. 30D is an enlarged view of area A1 of FIG. 30A.

FIG. 30B is a cross sectional view corresponding to the plane $P_{XY}$ along X1-X1 line of FIG. 30A, FIG. 30C is an enlarged view of area A2 of FIG. 30A and FIG. 30D is an enlarged view of area A1 of FIG. 30A. As shown in FIGS. 30B and 30D, residual dummy gate dielectric layers 135 remain between the gate dielectric layer 130', the first and second sidewall spacers 54 and 56, and the stacked dielectric layer 120. As shown in FIGS. 30B and 30C, residual dummy gate dielectric layers 135 remain between the gate dielectric layer 130', the first and second sidewall spacers 54 and 56, and the isolation insulting layer 20 or the semiconductor wire 35S.

It will be understood that not all advantages have been necessarily discussed herein, no particular advantage is required for all embodiments or examples, and other embodiments or examples may offer different advantages.

For example, in the present disclosure, a 2T-SONOS NVM cell having a select transistor and a control transistor is employed, which is easier to be scaled down compared with a NVM cell having a floating gate. Further, by employing a gate-all-around structure, it is possible to more precisely control the memory operation and to improve write/read/erase operations. In addition, it is possible to further reduce the device size by using the gate-all-around configuration of the present disclosure.

In accordance with an aspect of the present disclosure, in a method of forming a semiconductor device including a non-volatile memory (NVM) cell, a semiconductor wire is formed over an isolation insulating layer disposed on a substrate. The semiconductor wire includes a select gate portion and a control gate portion. A stacked dielectric layer is formed around the control gate portion of the semiconductor wire. A gate dielectric layer is formed around the select gate portion of the semiconductor wire and on the stacked dielectric layer formed around the control gate portion of the semiconductor wire. A dummy select gate structure including a dummy select gate layer is formed on the gate dielectric layer, and a dummy control gate structure including a dummy control gate layer is formed on the gate dielectric layer. The dummy select gate layer and the dummy control gate layer are replaced with a metal select gate layer and a metal control gate layer, respectively. In an embodiment, the semiconductor wire is formed by forming a mask pattern on a semiconductor layer disposed on the insulating layer, patterning the semiconductor layer by using the mask pattern as an etching mask, and removing part of the insulating layer, thereby forming the semiconductor wire. In an embodiment, before forming the mask pattern, a select gate well layer and a control gate well layer are formed in the semiconductor layer by one or more ion implantation operations. In an embodiment, after the semiconductor wire is formed, the select gate portion and the control gate portion are doped by one or more ion implantation operations. In an embodiment, the semiconductor wire is formed by forming a mask pattern on the substrate, etching the substrate, thereby forming a recess in the substrate and the semiconductor wire disposed over the recess, and forming the insulating layer in the recess. In an embodiment, before forming the mask pattern, a select gate well layer and a control gate well layer are formed in the substrate by one or more ion implantation operations. In an embodiment, after the semiconductor wire is formed, the select gate portion and the control gate portion are doped by one or more ion implantation operations. In an embodiment, the stacked dielectric layer includes a first dielectric layer made of oxide and disposed on the control gate portion of the semiconductor wire, a second dielectric layer disposed on the first dielectric layer, and a third dielectric layer made of oxide and disposed on the second dielectric layer. In an embodiment, the second dielectric layer includes one or more material selected from the group consisting of SiN, SiON, $HfO_2$ and $ZrO_2$. In an embodiment, the dummy select gate structure and the dummy control gate structure include first sidewall spacers disposed on opposing sides of the dummy select gate layer and the dummy control gate layer, respectively, and second sidewall spacers disposed on the first sidewall spacers. In an embodiment, the dummy select gate structure and the dummy control gate structure are formed by forming a dummy gate electrode layer on the gate dielectric layer, patterning the dummy gate electrode layer, thereby forming the dummy select gate layer and the dummy control gate layer and patterning the gate dielectric layer, forming the first sidewall spacers, and forming the second sidewall spacers. In an embodiment, between the forming the first sidewall spacers and the forming the second sidewall spacers, the stacked dielectric layer on the control gate portion not covered by the dummy control gate electrode and the first sidewall spacers is removed.

In accordance with another aspect of the present disclosure, in a method of forming a semiconductor device including a non-volatile memory (NVM) cell, a semiconductor wire is formed over an isolation insulating layer disposed on a substrate, the semiconductor wire includes a select gate portion and a control gate portion. A stacked dielectric layer is formed around the control gate portion of the semiconductor wire. A dummy gate dielectric layer is formed around the select gate portion of the semiconductor wire and on the stacked dielectric layer formed around the control gate portion of the semiconductor wire. A dummy select gate structure including a dummy select gate layer is formed on the gate dielectric layer, and a dummy control gate structure including a dummy control gate layer is formed on the dummy gate dielectric layer. The dummy gate dielectric layer, the dummy select gate layer and the dummy control gate layer are replaced with a gate dielectric layer, a metal select gate layer and a metal control gate layer, respectively. In an embodiment, the gate dielectric layer includes one or more material selected from the group consisting of $MgO_x$, $BaTi_xO_y$, $BaSr_xTi_yO_z$, $SrTiO_3$, $PbTi_xO_y$, $PbZr_xTi_yO_z$, SiCN, SiON, SiN, $Al_2O_3$, $La_2O_3$, $Ta_2O_3$, $Ta_2O_5$, $Y_2O_3$, $HfO_2$, $ZrO_2$, HfSiON, $YGe_xO_y$, $YSi_xO_y$ and $LaAlO_3$. In an embodiment, the select gate portion and the control gate portion are doped by one or more ion implantation operations. In an embodiment, the semiconductor wire is formed by forming a mask pattern on a semiconductor layer disposed on the insulating layer, patterning the semiconductor layer by using the mask pattern as an etching mask, and removing part of the insulating layer, thereby forming the semiconductor wire. In an embodiment, the semiconductor wire is formed by forming a mask pattern on the substrate, etching the substrate, thereby forming a recess in the substrate and the semiconductor wire disposed over the recess, and forming the insulating layer in the recess. In an embodiment, the stacked dielectric layer includes a first dielectric layer made of oxide and disposed on the control gate portion of the semiconductor wire, a second dielectric layer disposed on the first dielectric layer, and a third dielectric layer made of oxide and disposed on the second dielectric layer, and the second dielectric layer includes one or more material selected from the group consisting of SiN, SiON, $HfO_2$ and $ZrO_2$. In an embodiment, the dummy select gate structure and the dummy control gate structure include first sidewall spacers disposed on opposing sides of the dummy select gate layer and the dummy control gate layer, respectively, and second sidewall spacers disposed on the first sidewall spacers.

In accordance with another aspect of the present disclosure, a semiconductor device includes a non-volatile memory (NVM) cell. The NVM cell includes a semiconductor wire including a select gate portion and a control gate portion. The NVM cell includes a select transistor formed at the select gate portion and a control transistor formed at the control gate portion. The select transistor includes a gate dielectric layer disposed around the select gate portion and a select gate electrode disposed on the gate dielectric layer. The control transistor includes a stacked dielectric layer disposed around the control gate portion, a gate dielectric layer disposed on the stacked dielectric layer and a control gate electrode disposed on the gate dielectric layer. The stacked dielectric layer includes a first silicon oxide layer disposed on the control gate portion, a charge trapping layer disposed on the first silicon oxide, and a second silicon oxide layer disposed on the charge trapping layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor wire horizontally extending and disposed over an isolation insulating layer disposed on a substrate;
a first gate structure including a first gate dielectric layer disposed around a first portion of the semiconductor wire and a first gate electrode disposed on the first gate dielectric layer; and
a second gate structure including a second gate dielectric layer disposed around a second portion of the semiconductor wire, a third gate dielectric layer disposed on the second gate dielectric layer and a second gate electrode disposed on the third gate dielectric layer.

2. The semiconductor device of claim 1, wherein the second gate dielectric layer includes two or more layers.

3. The semiconductor device of claim 2, wherein the second gate dielectric layer includes a first silicon oxide layer disposed on the second portion, a charge trapping layer disposed on the first silicon oxide, and a second silicon oxide layer disposed on the charge trapping layer.

4. The semiconductor device of claim 3, wherein the charge trapping layer includes one or more material selected from the group consisting of SiN, SiON, $HfO_2$ and $ZrO_2$.

5. The semiconductor device of claim 1, wherein the first gate dielectric layer and the third gate dielectric layer are made of a same material.

6. The semiconductor device of claim 5, wherein the same material of the first and third gate dielectric layers includes $HfO_2$, $ZrO_2$, or HfSiON.

7. The semiconductor device of claim 1, further including a dielectric layer disposed over the semiconductor wire and between the semiconductor wire and the isolation insulating layer.

8. A semiconductor device comprising:
a semiconductor wire disposed over an isolation insulating layer disposed on a substrate;
a first gate structure including a first gate dielectric layer disposed around a first portion of the semiconductor wire and a first gate electrode including a metal material and disposed on the first gate dielectric layer;
a second gate structure including a second gate dielectric layer disposed around a second portion of the semiconductor wire, a third gate dielectric layer disposed on the second gate dielectric layer and a second gate electrode including the metal material and disposed on the third gate dielectric layer; and
a dielectric layer made of a same material as the second gate dielectric layer and a dielectric layer made of a same material as the third gate dielectric layer, which are disposed between the second gate electrode and the isolation insulating layer.

9. The semiconductor device of claim 8, wherein the second gate dielectric layer includes multiple insulating layers.

10. The semiconductor device of claim 9, wherein:
the first gate structure further includes first gate sidewall spacers disposed on side faces of the first gate electrode,
the second gate structure further includes second gate sidewall spacers disposed on side faces of the second gate electrode, and
the second sidewall spacers are in contact with the second gate dielectric layer and the third gate dielectric layer.

11. The semiconductor device of claim 9, wherein:
the first gate structure further includes first gate sidewall spacers disposed on side faces of the first gate electrode,
the second gate structure further includes second gate sidewall spacers disposed on side faces of the second gate electrode, and
the second sidewall spacers are separated from the second gate dielectric layer by the third gate dielectric layer.

12. The semiconductor device of claim 9, wherein:
the first gate structure further includes first gate sidewall spacers disposed on side faces of the first gate electrode,
the second gate structure further includes second gate sidewall spacers disposed on side faces of the second gate electrode, and
the second sidewall spacers are separated from the second gate dielectric layer by a dielectric layer different from the third gate dielectric layer.

13. The semiconductor device of claim 9, wherein:
the first gate structure further includes first gate sidewall spacers disposed on side faces of the first gate electrode,
the second gate structure further includes second gate sidewall spacers disposed on side faces of the second gate electrode,
the first gate dielectric layer includes a horizontal portion disposed on the first portion of the semiconductor wire and a vertical portion disposed along the first sidewall spacers, and the third gate dielectric layer includes a horizontal portion disposed on the second gate dielectric layer and a vertical portion disposed along the second sidewall spacers.

14. The semiconductor device of claim 9, wherein the second gate dielectric layer includes a first silicon oxide layer, a silicon nitride layer and a second silicon oxide layer.

15. The semiconductor device of claim 9, wherein the first gate dielectric layer and the third gate dielectric layer are made of $HfO_2$.

16. A semiconductor device comprising:
a semiconductor wire disposed over an isolation insulating layer disposed on a substrate;
a first gate structure including a first gate dielectric layer disposed around a first portion of the semiconductor wire and a first gate electrode including a metal material and disposed on the first gate dielectric layer;
a second gate structure including a second gate dielectric layer disposed around a second portion of the semiconductor wire, a third gate dielectric layer disposed on the second gate dielectric layer and a second gate electrode including the metal material and disposed on the third gate dielectric layer; and
an interlayer dielectric layer disposed between the first gate structure, the second gate structure and the isolation insulating layer.

17. The semiconductor device of claim 16, wherein:
each of the first gate structure and the second gate structure further includes first gate sidewall spacers disposed on side faces of the first gate electrode and second gate sidewall spacers disposed on the first gate sidewall spacers.

18. The semiconductor device of claim 17, wherein the second gate sidewall spacers further incudes a horizontal portion disposed between the isolation insulating layer and the interlayer dielectric layer.

19. The semiconductor device of claim 18, wherein the second gate sidewall spacers of the first gate structure and the second gate sidewall spacers of the second gate structure are continuous.

20. The semiconductor device of claim 16, wherein:
the first gate dielectric layer and the third gate dielectric layer include a high-k dielectric layer, and
the second dielectric layer includes at least one of a silicon oxide layer or a silicon nitride layer.

* * * * *